US011217675B2

(12) United States Patent
Mehrotra et al.

(10) Patent No.: US 11,217,675 B2
(45) Date of Patent: Jan. 4, 2022

(54) TRENCH WITH DIFFERENT TRANSVERSE CROSS-SECTIONAL WIDTHS

(71) Applicant: NXP USA, INC., Austin, TX (US)

(72) Inventors: Saumitra Raj Mehrotra, Scottsdale, AZ (US); Bernhard Grote, Phoenix, AZ (US); Ljubo Radic, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/836,344

(22) Filed: Mar. 31, 2020

(65) Prior Publication Data

US 2021/0305385 A1    Sep. 30, 2021

(51) Int. Cl.
*H01L 29/78* (2006.01)
*H01L 29/423* (2006.01)
*H01L 29/66* (2006.01)
*H01L 29/40* (2006.01)

(52) U.S. Cl.
CPC ........ *H01L 29/4236* (2013.01); *H01L 29/407* (2013.01); *H01L 29/66704* (2013.01); *H01L 29/7823* (2013.01); *H01L 29/7825* (2013.01)

(58) Field of Classification Search
CPC ........ H01L 29/08; H01L 29/10; H01L 29/40; H01L 29/66; H01L 29/78; H01L 29/404; H01L 29/407; H01L 29/0865; H01L 29/0869; H01L 29/0878; H01L 29/0882; H01L 29/1095; H01L 29/4236; H01L 29/7823; H01L 29/7825; H01L 29/7827; H01L 29/66666; H01L 29/66704; H01L 29/665; H01L 29/66734; H01L 29/66621; H01L 29/66659; H01L 29/7813; H01L 29/7835; H01L 21/765; H01L 21/3213; H01L 21/32136
USPC ........................................................ 257/331
See application file for complete search history.

(56) References Cited

U.S. PATENT DOCUMENTS

| | | | |
|---|---|---|---|
| 4,553,151 A | 11/1985 | Schutten et al. |
| 4,893,160 A | 1/1990 | Blanchard |
| 5,316,959 A | 5/1994 | Kwan et al. |
| 5,324,683 A | 6/1994 | Fitch et al. |
| 5,407,860 A | 4/1995 | Stoltz et al. |
| 5,434,435 A | 7/1995 | Baliga |
| 5,723,891 A | 3/1998 | Malhi |
| 5,736,446 A | 4/1998 | Wu et al. |
| 5,770,507 A | 6/1998 | Chen et al. |
| 5,869,379 A | 2/1999 | Gardner et al. |

(Continued)

FOREIGN PATENT DOCUMENTS

WO    2005093841 A2    10/2005

OTHER PUBLICATIONS

Cha, H., "0.18um 100V-rated BCD with Large Area Power LDMOS with ultra-low effective Specific Resistance", IEEE, Jun. 12-16, 2016.

(Continued)

*Primary Examiner* — Chuong A Luu
(74) *Attorney, Agent, or Firm* — David G. Dolezal

(57) ABSTRACT

A semiconductor device includes a trench in a semiconductor material having a device section and a termination section. A gate structure is located in the trench. With some embodiments, the transverse cross-sectional width of the termination section is wider than the transverse cross-sectional width of the device section.

22 Claims, 27 Drawing Sheets

(56) References Cited

U.S. PATENT DOCUMENTS

| | | | |
|---|---|---|---|
| 5,914,519 | A | 6/1999 | Chou et al. |
| 6,064,107 | A | 5/2000 | Yeh et al. |
| 6,277,700 | B1 | 8/2001 | Yu et al. |
| 6,858,500 | B2 | 2/2005 | Sugi et al. |
| 6,861,332 | B2 | 3/2005 | Park et al. |
| 6,864,135 | B2 | 3/2005 | Grudowski et al. |
| 6,946,348 | B2 | 9/2005 | Zeng |
| 7,368,785 | B2 | 5/2008 | Chen et al. |
| 7,400,024 | B2 | 7/2008 | Kunnen |
| 7,576,388 | B1 | 8/2009 | Wilson et al. |
| 7,579,650 | B2 | 8/2009 | Cao et al. |
| 7,709,889 | B2 | 5/2010 | Moens et al. |
| 7,759,206 | B2 | 7/2010 | Luo et al. |
| 7,800,167 | B2 | 9/2010 | Kitamura et al. |
| 7,893,488 | B2 | 2/2011 | Hebert |
| 7,923,776 | B2 | 4/2011 | Yilmaz et al. |
| 8,043,913 | B2 | 10/2011 | Yilmaz et al. |
| 8,304,312 | B2 | 11/2012 | Hebert |
| 8,319,278 | B1 | 11/2012 | Zeng et al. |
| 8,329,538 | B2 | 12/2012 | Pan et al. |
| 8,502,287 | B2 | 8/2013 | Radic et al. |
| 8,647,950 | B2 | 2/2014 | Zuniga et al. |
| 8,716,794 | B2 | 5/2014 | Xiaorong et al. |
| 8,742,495 | B2 | 6/2014 | Parthasarathy et al. |
| 8,981,470 | B2 | 3/2015 | Nozu |
| 9,171,931 | B2 | 10/2015 | Ng et al. |
| 9,559,198 | B2 | 1/2017 | Stefanov et al. |
| 9,620,583 | B2 | 4/2017 | Kelkar et al. |
| 10,103,257 | B1 | 10/2018 | Qin et al. |
| 10,424,646 | B2 | 9/2019 | Mehrotra et al. |
| 10,600,911 | B2 | 3/2020 | Grote et al. |
| 2004/0021233 | A1 | 2/2004 | Kinzer et al. |
| 2006/0001084 | A1 | 1/2006 | Kelly et al. |
| 2006/0017078 | A1 | 1/2006 | Thapar |
| 2006/0209586 | A1 | 9/2006 | Hirler |
| 2007/0274110 | A1 | 11/2007 | Kitamura et al. |
| 2009/0256212 | A1 | 10/2009 | Denison et al. |
| 2010/0006929 | A1 | 1/2010 | Andou |
| 2010/0015770 | A1 | 1/2010 | Tai et al. |
| 2010/0244125 | A1 | 9/2010 | Sonsky et al. |
| 2013/0105888 | A1 | 5/2013 | Zuniga et al. |
| 2013/0181723 | A1 | 7/2013 | Mauder et al. |
| 2013/0334565 | A1 | 12/2013 | Hutzler et al. |
| 2014/0021534 | A1 | 1/2014 | Verma et al. |
| 2014/0097492 | A1 | 4/2014 | Yu |
| 2014/0138739 | A1 | 5/2014 | Magri et al. |
| 2014/0225186 | A1 | 8/2014 | Abou-Khalil et al. |
| 2015/0084123 | A1 | 3/2015 | Kawashiri et al. |
| 2015/0137223 | A1 | 5/2015 | Siemieniec et al. |
| 2015/0380348 | A1 | 12/2015 | Noebauer et al. |
| 2015/0380538 | A1 | 12/2015 | Ogawa |
| 2016/0020315 | A1 | 1/2016 | Hirler |
| 2016/0211348 | A1 | 7/2016 | Yoshida |
| 2016/0268423 | A1 | 9/2016 | Koepp et al. |
| 2016/0359029 | A1 | 12/2016 | Zeng et al. |
| 2017/0263767 | A1 | 9/2017 | Nishiwaki |
| 2017/0338337 | A1 | 11/2017 | Bobde et al. |
| 2018/0006026 | A1 | 1/2018 | Lui |
| 2018/0006109 | A1 | 1/2018 | Mauder et al. |
| 2018/0090490 | A1 | 3/2018 | Lin et al. |
| 2019/0097045 | A1 | 3/2019 | Grote et al. |
| 2019/0097046 | A1 | 3/2019 | Mehrotra et al. |
| 2019/0206987 | A1 | 7/2019 | Adachi et al. |
| 2019/0280094 | A1* | 9/2019 | Grote .................. H01L 29/404 |
| 2020/0098912 | A1 | 3/2020 | Grote et al. |

OTHER PUBLICATIONS

Cheng, K., "Air Spacer for 10nm FinFET CMOS and Beyond", IEEE, Dec. 2016.

Chil, M., "Advanced 300mm 130NM BCD technology from 5V to 85V with Deep-Trench Isolation", IEEE, Jun. 12-16, 2016.

Fujishima, D.H., "Integrated Bi-directional Trench Lateral Power MOSFETs for One Chip Lithium-ion Battery Protection ICs", Proceedings of the 17 International Symposium on Power Semiconductor Devices & IC's, Santa Barbara, CA, May 23-26, 2005.

Huang, T., "0.18um BCD Technology with Best-in-Class LDMOS from 6 V to 45 V", Proceedings of the 26th International Symposium on Power Semiconductor Devices & IC's, Jun. 15-19, 2014.

Kumar, M., "Extended-p+ Stepped Gate LDMOS for Improved Performance", IEEE Transactions on Electron Devices, vol. 57, No. 7, Jul. 2010.

Lu, D.H., "Integrated Bi-directional Trench Lateral Power MOSFETs for One Chip Lithium-ion Battery Protection ICs", Proceedings of the 17th International Symposium on Power Semiconductor Devices & IC's, May 23-26, 2005.

Takaya, H., "Floating Island and Thick Bottom Oxide Trench Gate MOSFET (FITMOS)—A 60V Ultra Low On-Resistance Novel MOSFET with Superior Internal Body Diode-1", Proceedings of the 17th International Symposium on Power Semiconductor Devices & IC's, May 23-26, 2005.

Yang, H., "Low-Leakage SMARTMOS 10W Technology at 0.13um Node with Optimized Analog, Power and Logic Devices for SOC Design", IEEE, Apr. 21-23, 2008.

Yang, H., "Approach to the Silicon Limit: Advanced NLDMOS in 0.13 um SOI Technology for Automotive and Industrial Applications up to 110V", Proceedings of the 25th International Symposium on Power Semiconductor Devices & ICs, Kanazawa; May 2013.

Zhigang, W., "Analysis of OFF-state and ON-state performance In a silicon-on-insulator power MOSFET with a low-k dielectric trench", Chinese Institute of Electronics, Journal of Semiconductors, vol. 34, No. 7, Jul. 2013.

U.S. Appl. No. 16/141,674, filed Sep. 25, 2018, entitled "Transistor Devices With Control-Terminal Field Plate Structures in Trenches".

U.S. Appl. No. 16/171,830, filed Oct. 26, 2018, entitled "Transistor Devices With Extended Drain Regions Located in Trench Sidewalls".

U.S. Appl. No. 16/174,955, filed Oct. 30, 2018, entitled "Vertical Transistor With Extended Drain Region".

U.S. Appl. No. 16/205,461, filed Nov. 30, 2018, entitled "Transistor With Gate/Field Plate Structure".

Non-final office action dated Oct. 15, 2018 in U.S. Appl. No. 15/715,816.

Nan-final office action dated Nov. 16, 2018 in U.S. Appl. No. 15/715,852.

Non-final office action dated Feb. 21, 2019 in U.S. Appl. No. 15/715,816.

Ex-Parte Quayle action dated Mar. 5, 2019 in U.S. Appl. No. 15/715,852.

Non-final office action dated Apr. 9, 2019 in U.S. Appl. No. 15/715,831.

Ex-Parte Quayle action dated Apr. 24, 2019 in U.S. Appl. No. 15/715,852.

Final office action dated Jun. 7, 2019 in U.S. Appl. No. 15/715,816.

Notice of Allowance dated Jul. 9, 2019 in U.S. Appl. No. 15/715,852.

Final office action dated Jul. 18, 2019 in U.S. Appl. No. 15/715,831.

Non-final office action dated Jul. 25, 2019 in U.S. Appl. No. 15/918,563.

Non-final office action dated Aug. 8, 2019 in U.S. Appl. No. 15/715,816.

Notice of Allowance dated Sep. 25, 2019 in U.S. Appl. No. 15/715,831.

Final office action dated Nov. 19, 2019 in U.S. Appl. No. 15/715,816.

U.S. Appl. No. 16/692,517, filed Nov. 22, 2019, entitled "Transistor Formed With Spacer".

Ex-Parte Quayle dated Jan. 7, 2020 in U.S. Appl. No. 16/174,955.

Notice of Allowance dated Jan. 21, 2020 in U.S. Appl. No. 15/715,816.

Notice of Allowance dated Feb. 4, 2020 in U.S. Appl. No. 15/918,563.

U.S. Appl. No. 16/715,396, filed Dec. 16, 2019, entitled "Transistor With Extended Drain Region".

Qiao, M., "A Novel Substrate-Assisted RESURF Technology for Small Curvature Radius Junction", Proceedings of the 23rd International Symposium on Power Semiconductor Devices & IC's, May 23-26, 2011.

U.S. Appl. No. 16/836,293, filed Mar. 31, 2020, entitled "Transistor Trench With Field Plate Structure".

(56) References Cited

OTHER PUBLICATIONS

Notice of Allowance dated Jun. 24, 2020 in U.S. Appl. No. 16/205,461.
U.S. Appl. No. 17/139,820, filed Dec. 31, 2020, entitled "Transistor Devices With Termination Regions".
Notice of Allowance dated Apr. 21, 2020 in U.S. Appl. No. 16/174,955.
Non-final office action dated May 4, 2020 in U.S. Appl. No. 16/171,830.
Notice of Allowance dated Aug. 21, 2020 in U.S. Appl. No. 16/171,830.
Notice of Allowance dated Apr. 21, 2021 in U.S. Appl. No. 16/836,293.
Non-final office action dated May 12, 2021 in U.S. Appl. No. 16/141,674.
Non-final office action dated May 21, 2021 in U.S. Appl. No. 16/715,396.
Non-final office action dated Oct. 29, 2021 in U.S. Appl. No. 16/692,517.

* cited by examiner

TRENCH WITH DIFFERENT TRANSVERSE CROSS-SECTIONAL WIDTHS

BACKGROUND OF THE INVENTION

Field of the Invention

This invention relates in general to semiconductor devices and more specifically to transistors with a gate structure in a trench.

Background

Some types of transistors include transistor structures located in a trench of a substrate. For example, some types of transistors include gate structures and field plate structures located in a trench.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed in some embodiments herein, a semiconductor device includes a trench in a semiconductor material having a device section and a termination section. With some embodiments, the transverse cross-sectional width of the termination section is wider than the transverse cross-sectional width of the device section. In some embodiments, a trench with a greater transverse cross-sectional width in the termination section may lead to an improvement in breakdown voltage by compensating for different doping levels due to the curved surfaces in the termination. Since the drift region is formed by implanting ions at an angle through the trench opening in a self-aligned manner, dopants may accumulate at a higher or lower than desirable level due to geometric shape of the trench layout. Without such compensation, deviations from the targeted doping concentration may cause a lower breakdown voltage in the termination region. The targeted doping concentration is determined by optimizing the performance of the interior device In some embodiments, methods described herein may provide for a simplified process for forming a transistor with a gate structure and field plate structure located in a trench wherein the gate structure and field plate structure are located closer to one sidewall of the trench than the other. In some embodiments, a greater amount of dielectric can be located between the gate and field plate and the drain sidewall of the trench than the source sidewall of the trench to accommodate the larger potential difference between drain and the source or gate connected field plate.

FIGS. 1, 2, 4-11, 13, 14, 16, 17, and 19-22 set forth partial cutaway side views of various stages in the manufacture of a semiconductor device according to one embodiment and FIGS. 3, 12, 15, 18, and 23 set forth partial top views of various stages in the manufacture of a semiconductor device according to the one embodiment. FIGS. 1, 4, 6, 8, 10, 13, 16, 19, and 21 are partial cutaway side views at one location of a wafer 101. FIGS. 2, 5, 7, 9, 11, 14, 17, 20, and 22 are partial cutaway side views at a second location of wafer 101. See FIGS. 3, 12, 15, 18, and 23 showing the two locations. As shown, in the top views, the two locations are orthogonal to each other.

Figure 1:
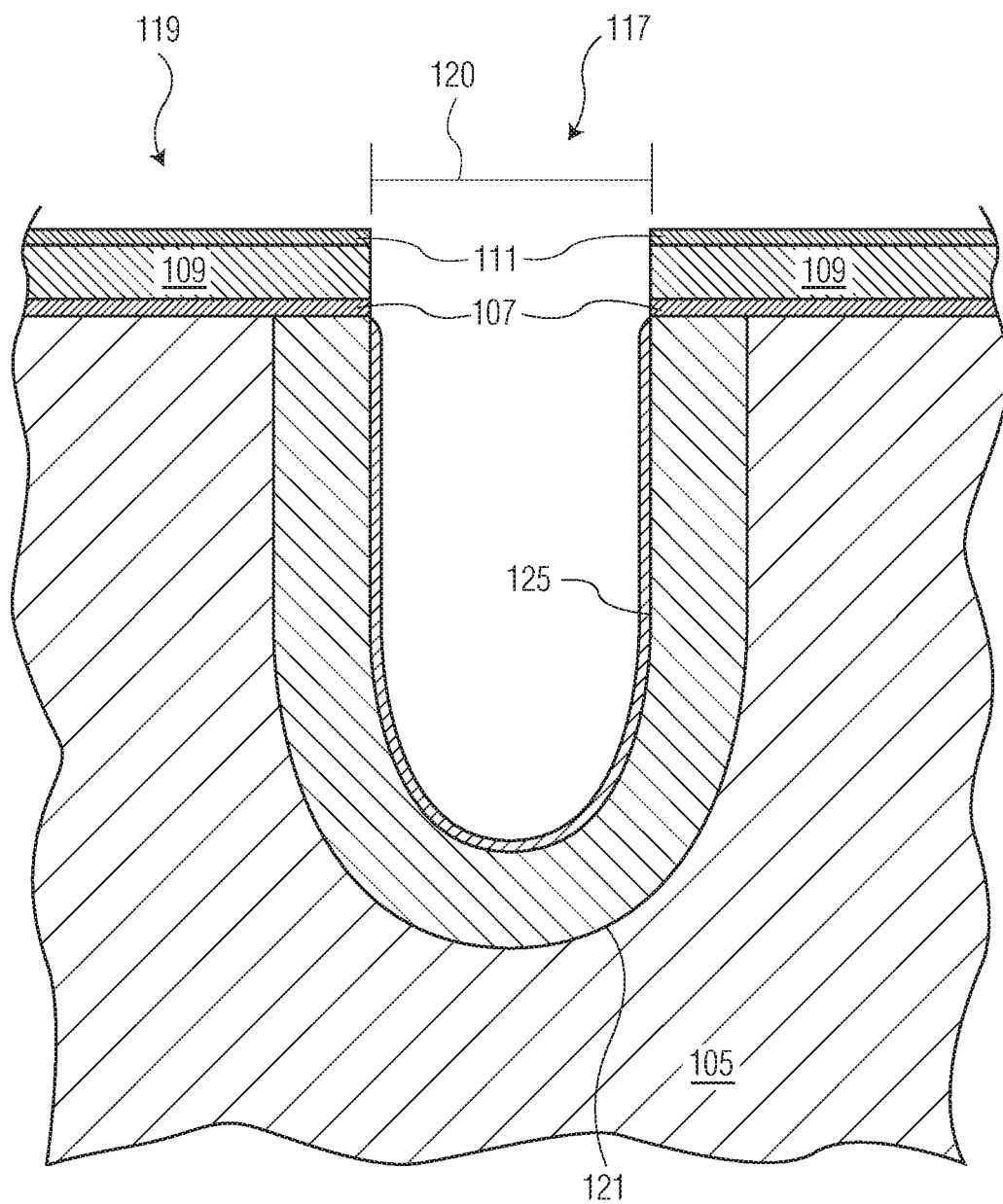
FIGS. 1, 2, 4-11, 13, 14, 16, 17, and 19-22 set forth partial cutaway side views of various stages in the manufacture of a semiconductor device according to one embodiment of the present invention.
Figure 2:
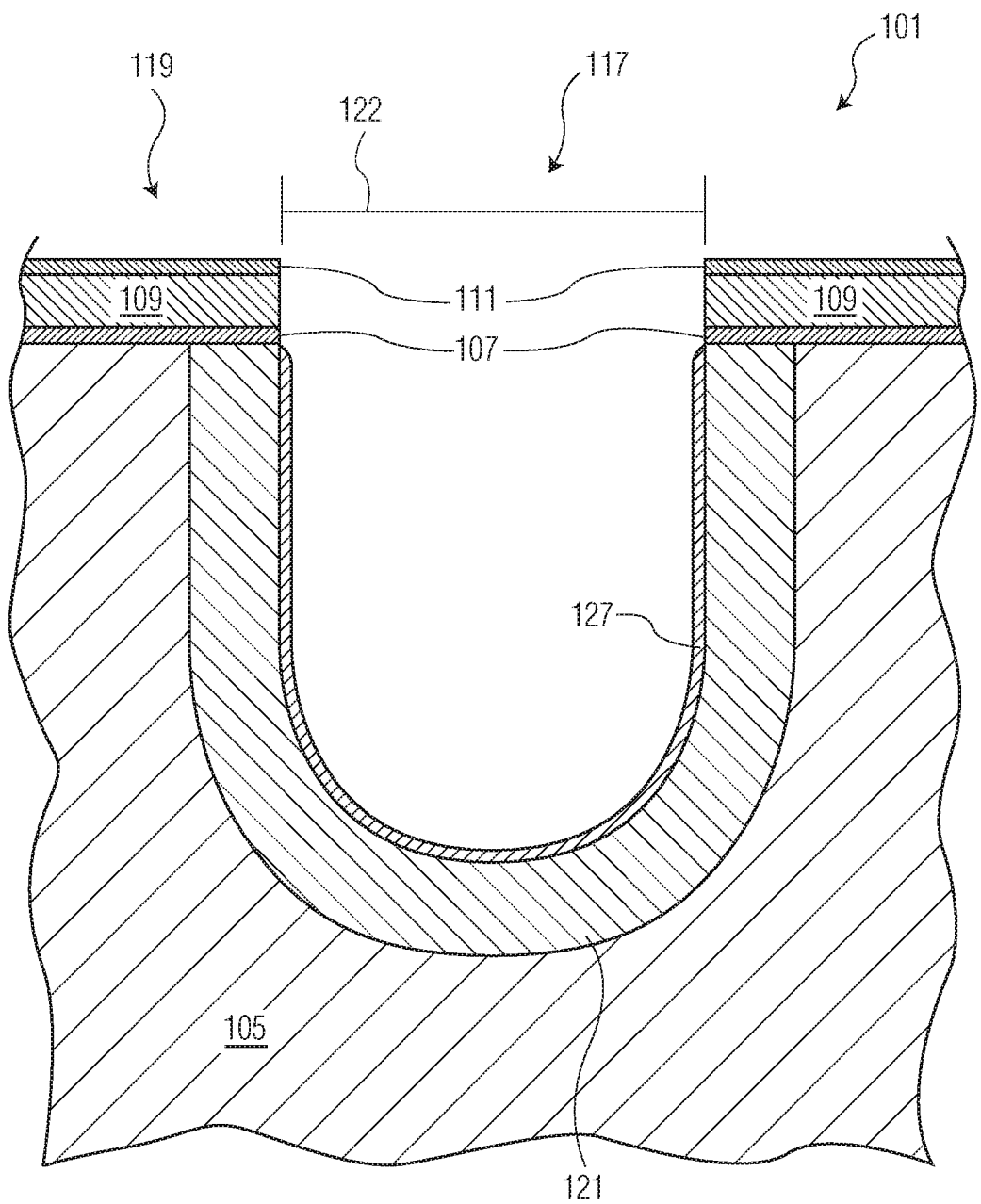
Figure 3:
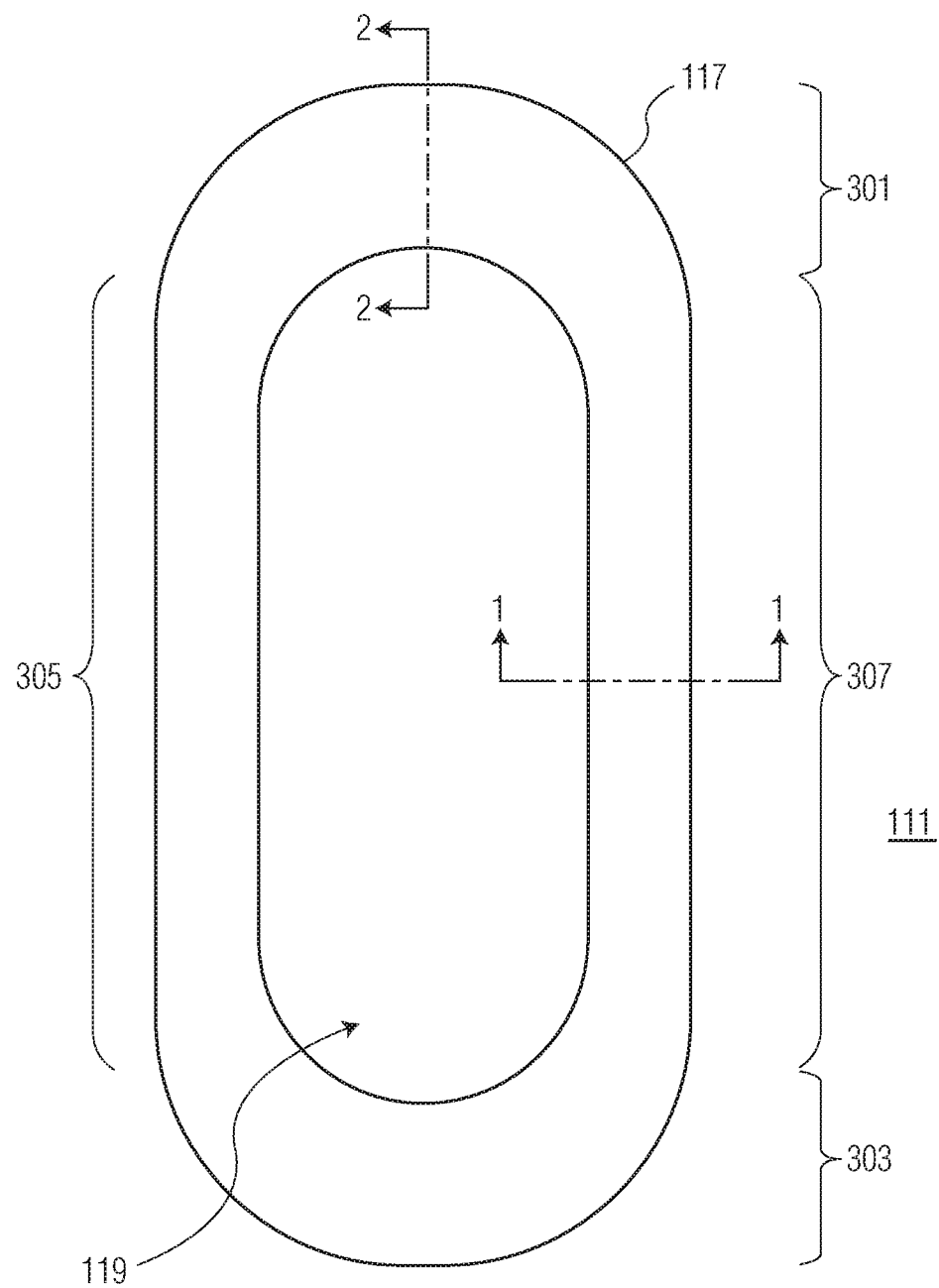
FIGS. 3, 12, 15, 18, and 23 set forth a partial top views of various stages in the manufacture of a semiconductor device according to one embodiment of the present invention.

FIGS. 1 and 2 are partial cutaway side view showing top portions of wafer 101 with trench 117 formed therein. FIG. 3 is a partial top view of wafer 101 showing the locations of the cutaway views of FIGS. 1 and 2. As shown in FIG. 3, the locations of the cutaway views of FIGS. 1 and 2 are orthogonal to each other.

In one embodiment, wafer 101 includes a semiconductor substrate 105. In one embodiment, substrate 105 is made of monocrystalline silicon, but may be made of other semiconductor material types (e.g. silicon germanium, germanium, silicon carbide, gallium nitride, gallium arsenide, other semiconductor III-V material, or combinations thereof) in other embodiments. In some embodiments, the portion of substrate 105 shown may be epitaxially grown from a base substrate (not shown). In one embodiment, the portion of substrate 105 shown is doped with boron and has a net P-type conductivity concentration of about 2e15 cm-3, but may be doped with other types of dopants and/or may be at other concentrations in other embodiments. In some embodiments, the epitaxially grown portion may be in-situ doped. In other embodiments, the top portion of substrate 105 is doped by ion implantation. In some embodiments, substrate 105 may include different layers of different semiconductor material types, may include different doped regions (not shown), and/or may include a buried dielectric layer (not shown) such as with a semiconductor on insulator (SOI) wafer.

A hard mask that will later define the trench opening is formed on substrate 105 using suitable materials and processes. In one embodiment as shown in FIGS. 1 and 2 the hard mask may consist of pad oxide layer 107, nitride layer 109, and oxide layer 111. In one embodiment, oxide layer 107 is 0.1 um thick, nitride layer 109 is 0.1 um thick, and oxide layer is 0.1 um thick, but these layers may be of other thickness in other embodiments.

After the formation of layers 107, 109, and 111, a trench 117 is formed in wafer 101. In one embodiment, trench 117 has a depth of 4 um, but may be of other depths in other embodiments. In one embodiment, trench 117 is formed by forming a patterned mask (not shown) on wafer 101 and then etching hard mask layers 111, 109, and 107 as per the pattern with the appropriate etch chemistries. In one embodiment, the etch is an anisotropic dry etch. In other embodiments, other types of hard mask layers may be utilized in forming trench 117. After etching the hard mask opening, the substrate 105 is etched to form trench 117. In one embodiment, the etch is a reactive ion etch. As shown in FIGS. 1 and 2, trench 117 includes a vertical component sidewall 130 and a vertical component sidewall 132.

In the embodiments shown, in the cross-sectional view of FIG. 2, trench 117 has transverse cross-sectional width 122 that is wider than the transverse cross-sectional width 120 as shown in the view of FIG. 1. As used herein, a transverse cross-sectional width of a location of a trench is the minimal cross-sectional width of any direction that is generally parallel with the major side of a wafer at the widest part of the trench at that location. In the embodiment shown, the widest part of trench 117 is at the top surface where the trench narrows towards the bottom. Where a trench has an orientation that runs in a straight line at a location (e.g. at the cross-section of FIG. 1), the transverse cross-sectional width is at an angle that is laterally perpendicular to the direction that the trench runs (at other angles, the cross-sectional width would be wider. FIGS. 1 and 2 show that transverse cross-sectional widths 120 and 122 at those locations, respectively.

As shown in the embodiment of FIG. 3, trench 117 has an oval ring shape where trench 117 has a wider transverse cross-sectional width at the terminal regions 301 and 303 than at device regions 305 and 307. In one embodiment, width 120 (see FIG. 1) is 1.0 um at device regions 305 and 307 and width 122 (see FIG. 2) is 1.5 um at termination regions 301 and 303. In some embodiments, width 122 is at least 10% greater than the width of cross-sectional width 120. In other embodiments, width 122 is at least 30% greater than the width of cross-sectional width 120. In other embodiments, width 122 is in a range of 10-200% greater than the width of cross-sectional width 120. In other embodiments, width 122 is in the range of 40-60% percent greater than the width of cross-sectional width 120.

In other embodiments, the trench may have different shapes (e.g. circle, open horse shoe, line segments). In the embodiment shown, trench 117 surrounds a source pillar 119 of substrate 105. As shown in subsequent embodiments, a source region (2133 in FIG. 21) for a transistor will be formed in pillar 119 and a drain region 2135 will be formed on the outside of trench 117.

After the formation of region 117, wafer 101 is subject to an oxidation process to form oxide layer 125 on the sidewalls of trench 117. In one embodiment, layer 125 has a thickness of 0.01 um, but may have other thicknesses in other embodiments.

After the formation of trench 117, wafer 101 is implanted with N-type ion dopants to form drift region 121 of n-LD-MOS transistor. In other embodiments, wafer 101 would be implanted with P-type dopants to form a drift region of a p-LDMOS transistor. In one embodiment, region 121 is doped with an N-type dopants such as phosphorus at a dosage of about 1e13 cm-2 and energy of 80 keV along with a P-type dopant such as boron at a dosage of 1e12 cm-2 and energy of 20 keV, but may be doped with other dopants, at other energies, and/or at other concentrations in other embodiments. In the embodiment shown, layers 107, 109, and 107 serve as an implant mask to inhibit ions from being implanted in other regions of substrate 105. In one embodiment, the ions are implanted at an angle 35 degrees, but may be implanted at other angles in other embodiments. After implantation, wafer 101 is annealed to drive the ions to their shown regions.

It can been understood from FIG. 3 that if dopants are uniformly implanted along the trench sidewall, there will be overcrowding of dopant density in the convex surface of pillar 119 in termination regions 301 and 303 leading to higher doping after diffusion due to lower volume per trench surface area than in the inner device regions 305 and 307. In contrast, the concave trench surface of the outer side of trench 117 will lead to lower doping density after diffusion due to higher volume per trench surface area compared to the device regions 305 and 307. The dopant density is expected to be similar on both inner and outer regions in the device regions 305 and 307. The impact of doping imbalance in the termination regions 301 and 303 on the breakdown voltage can be offset by increasing the trench width in the termination region.

Figure 4:
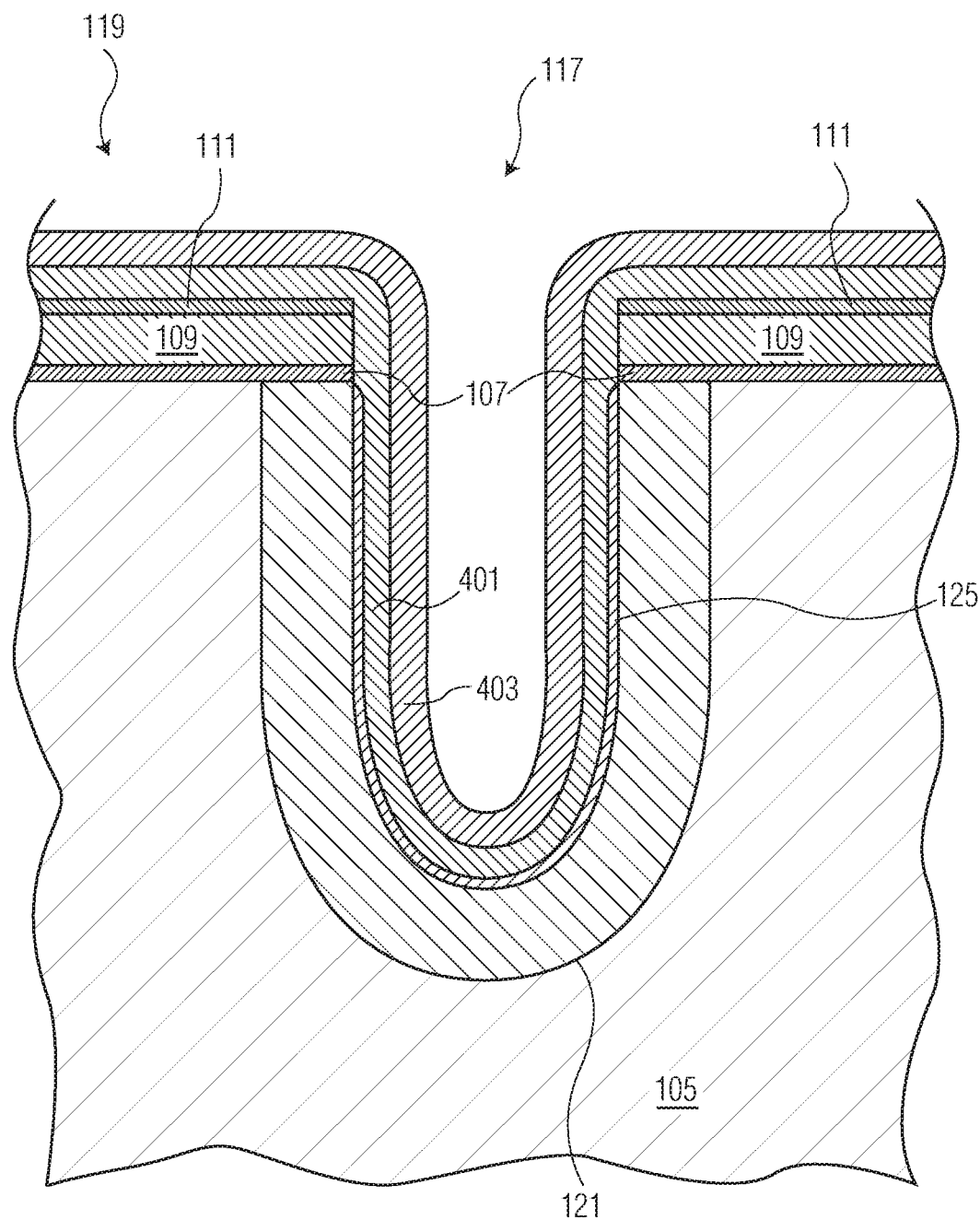
Figure 5:
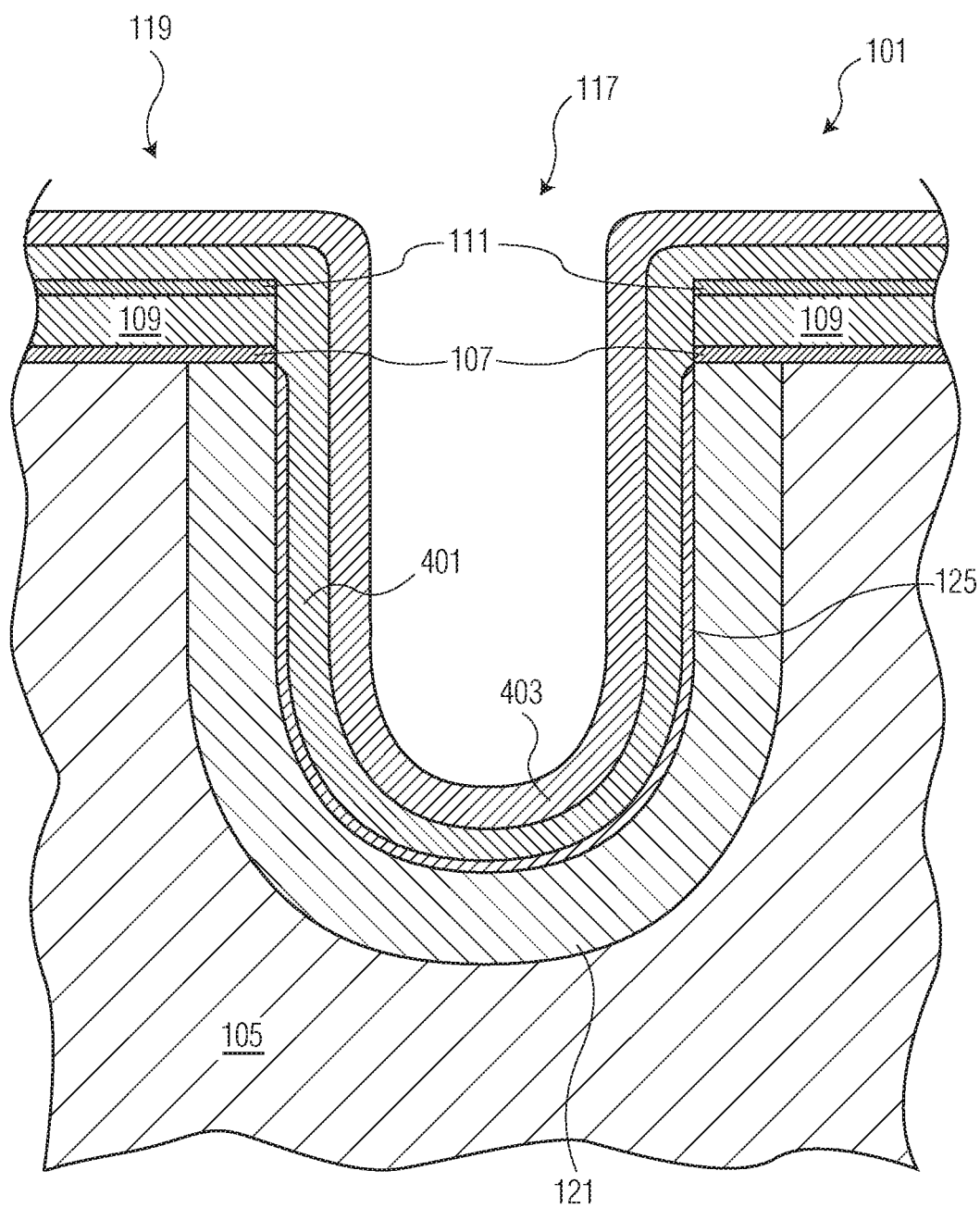

FIGS. 4 and 5 are partial cutaway side views of wafer 101 at the locations of FIGS. 1 and 2, respectively. FIGS. 4 and 5 show wafer 101 after a conformal layer 401 of oxide followed by a conformal layer 403 of field plate material are deposited over wafer 101. In one embodiment, oxide layer 401 has a thickness of 0.3 um and is deposited by a chemical vapor deposition process. However, in other embodiments, layer 401 may be formed by other processes (e.g. an oxidation process) or combinations thereof, have other thicknesses, and/or be made of other materials (e.g. another dielectric material). In one embodiment, layer 401 has a thickness so as to provide an adequate spacing between a subsequently formed field plate structure (e.g. 603 in FIG. 6) and the sidewall 130 of substrate 105 in a bottom part of a trench (e.g. 117) so as to provide a field dielectric thickness which can be optimized for breakdown voltage (BV) and on resistance (RonA).

Layer 403 is a layer of conductive field plate material, which in one embodiment is doped polysilicon, but may be of other materials in other embodiments. In one embodiment, layer 403 is formed by chemical vapor deposition process and has a thickness of about 0.25 um, but may be formed by other methods and/or have other thicknesses in other embodiments.

Figure 6:
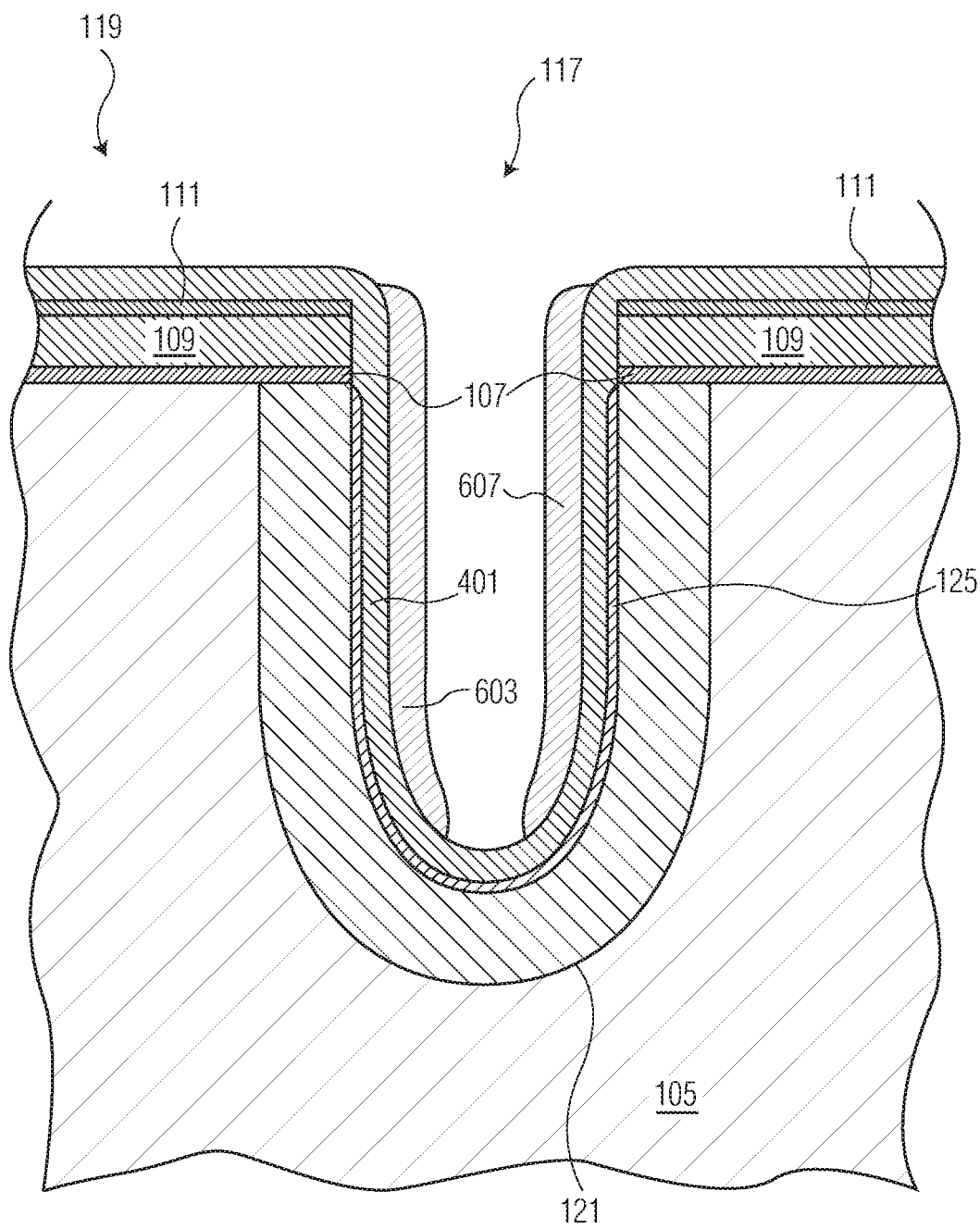
Figure 7:
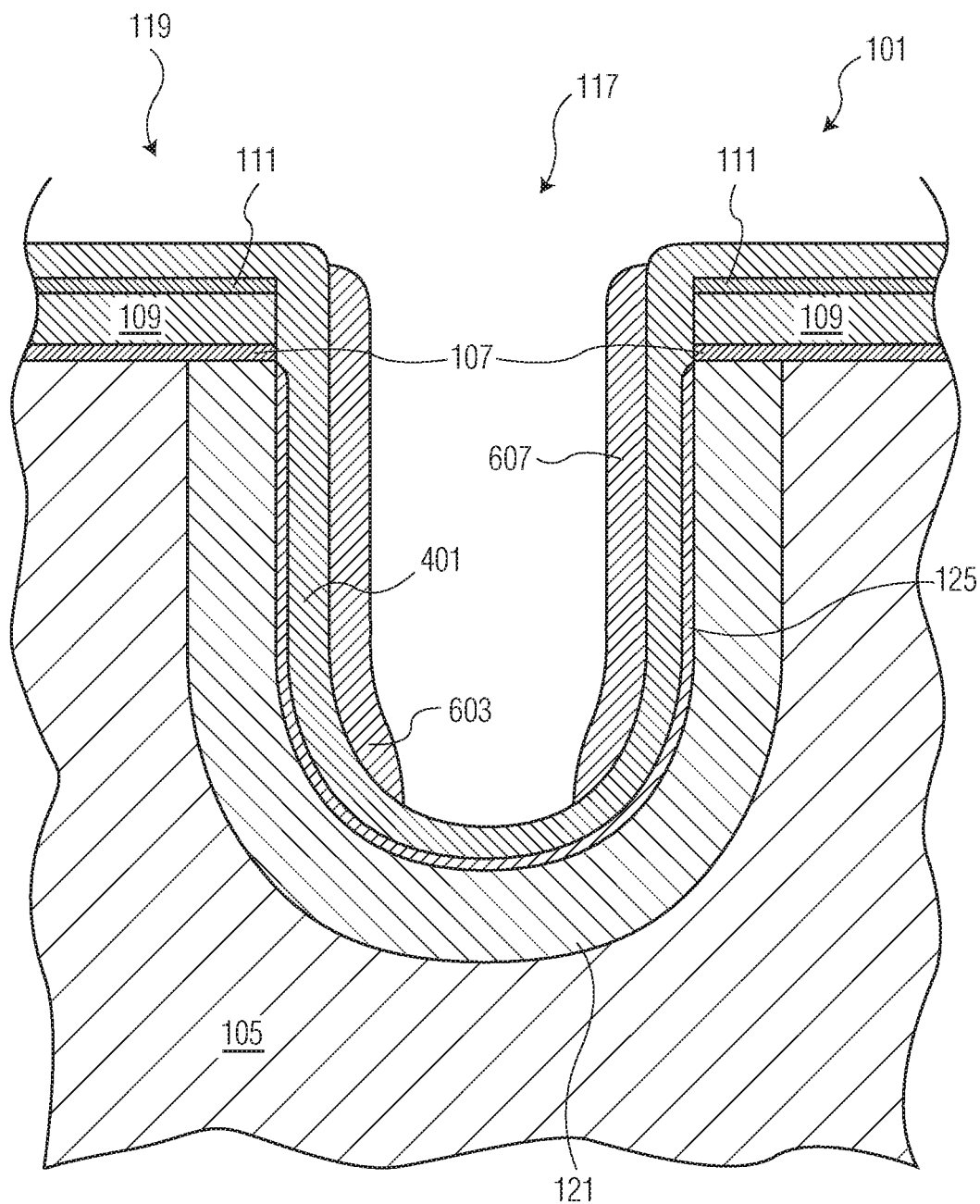

FIGS. 6 and 7 are partial cutaway side views of wafer 101 at the locations of FIGS. 1 and 2, respectively. FIGS. 6 and 7 show wafer 101 after layer 403 has been anisotropically etched to separate layer 403 into field plate structures 603 and 607 in trench 117. In one embodiment, layer 403 is etched with an etch chemistry that is selective to the material (e.g. polysilicon) of layer 403 and is selective with respect to the material (e.g. oxide) of layer 401 such that the oxide etches at negligible rates. In the embodiments shown, layer 403 is etched for a time such that the material of layer 403 is removed from outside of trench 117 above the top surface of layer 401. The etching removes a portion of layer 403 located at the bottom of trench 117 to physically separate layer 403 into two trench structures. The etching may also recess the top portion of structures 603 and 607.

Figure 8:
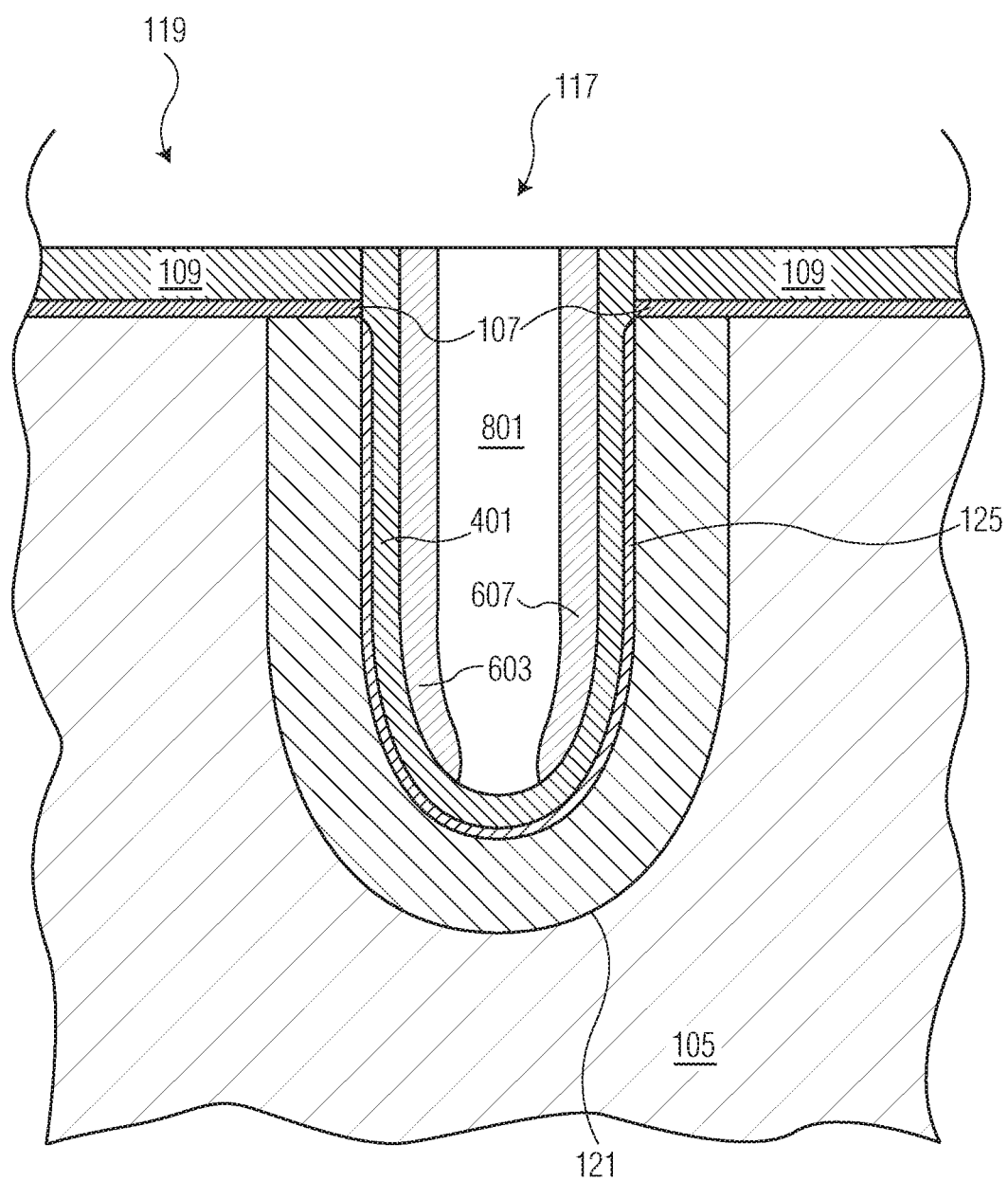
Figure 9:
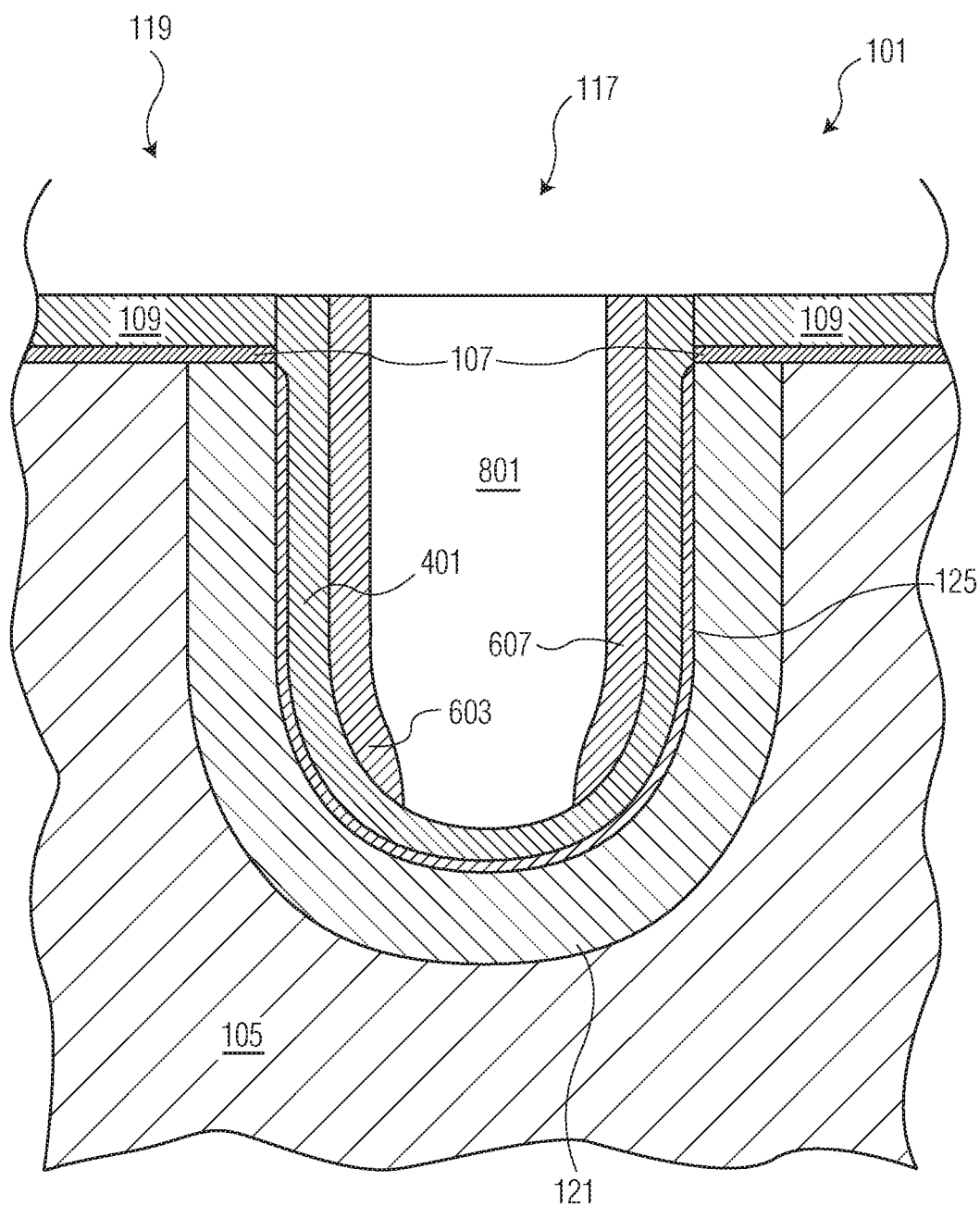

FIGS. 8 and 9 are partial cutaway side views of wafer 101 at the locations of FIGS. 1 and 2, respectively. FIGS. 8 and 9 show a partial side view after trench 117 is filled with a dielectric material (e.g. an oxide) and wafer 101 is planarized to remove layer 111. The planarization forms dielectric material structure 801 in between the field plate structures 603 and 607.

Figure 10:
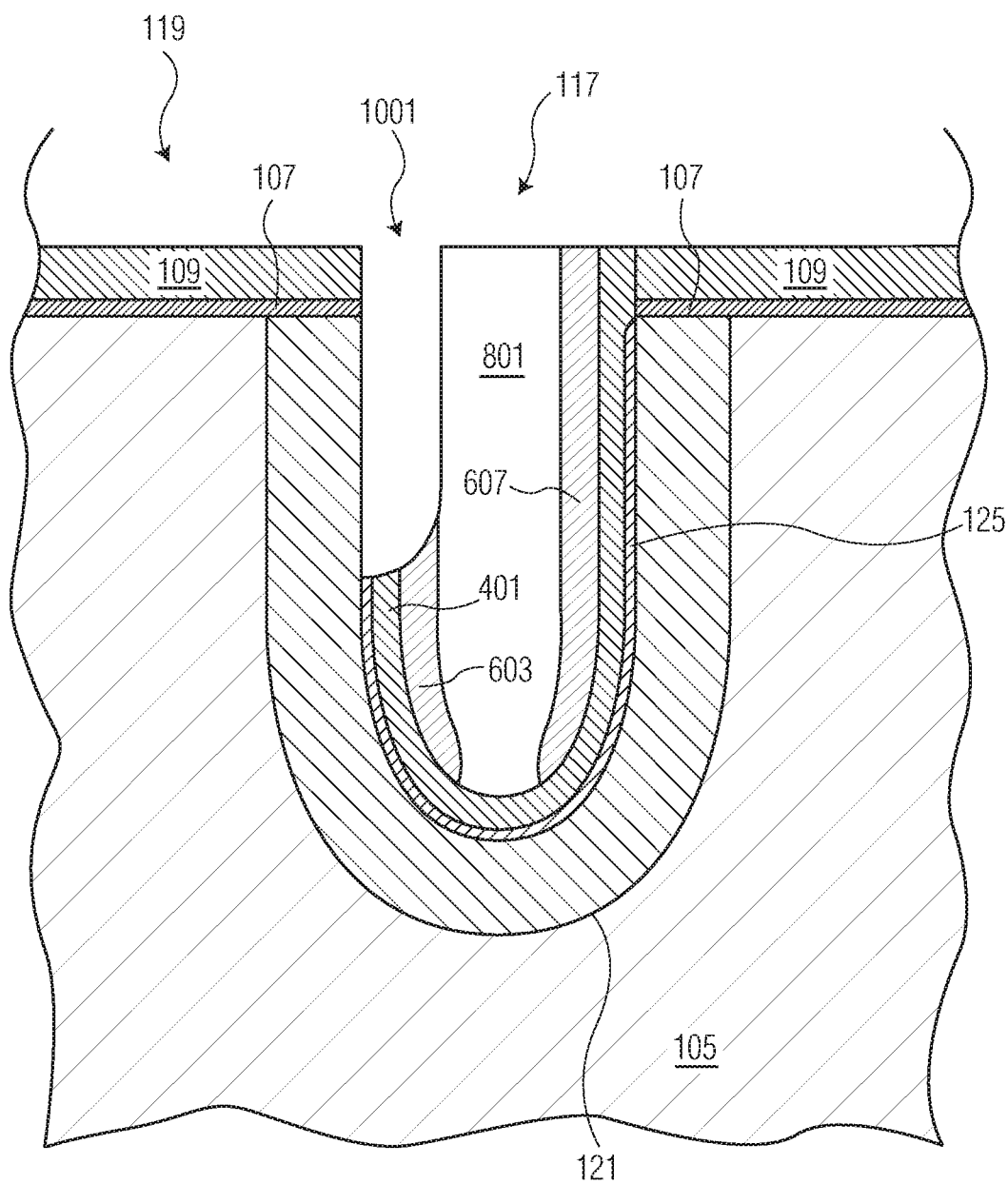
Figure 11:
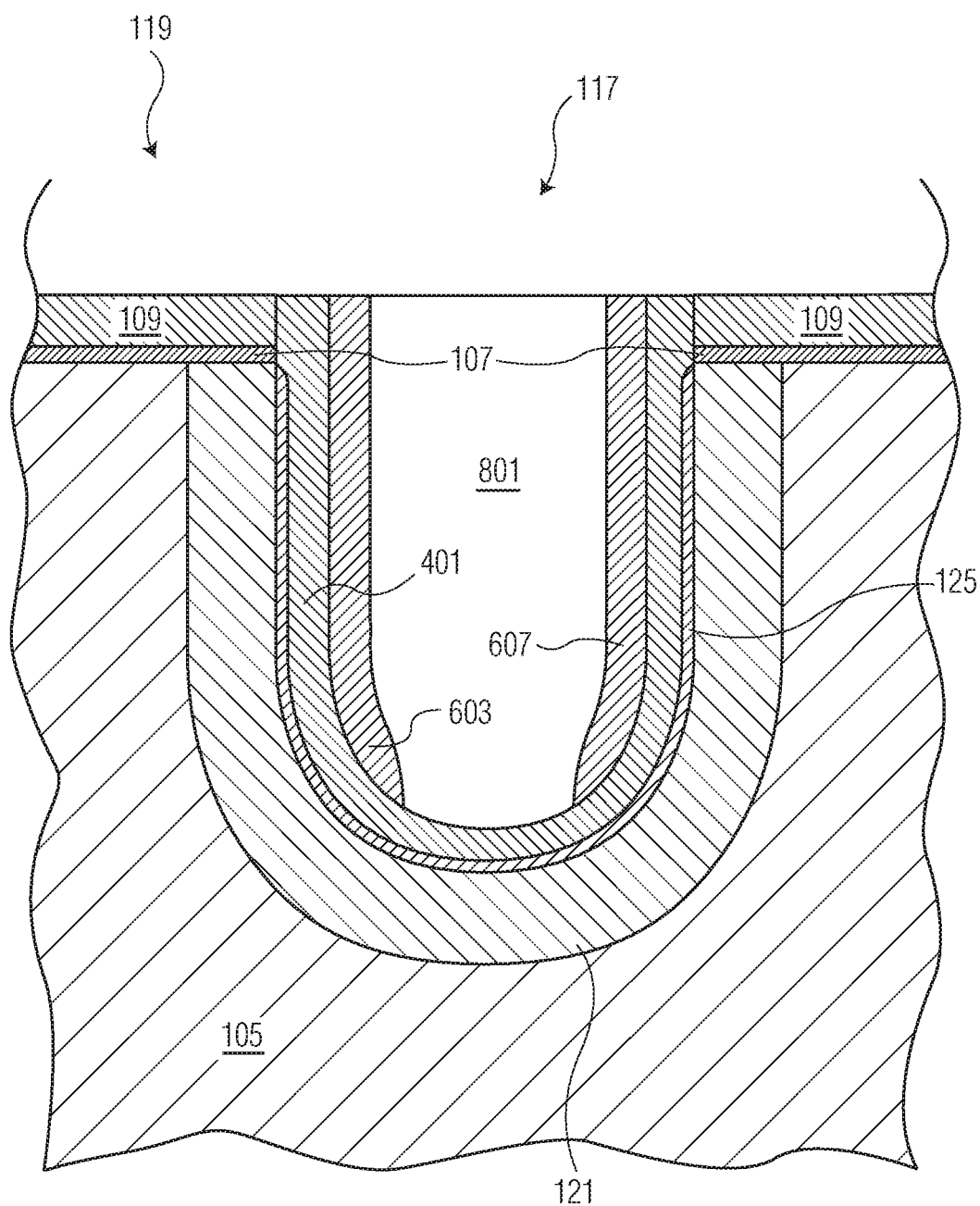

FIGS. 10 and 11 are partial cutaway side views of wafer 101 at the locations of FIGS. 1 and 2, respectively. FIGS. 10 and 11 show a partial side view after trench 1001 is formed in selective areas of trench 117 in a portion of dielectric material structure 801, a top portion of structure 603, and a portion of layer 401. Note that in the view of FIG. 11, trench 1001 is not formed in the location of the cross section of FIG. 11. In one embodiment, trench 1001 is formed by forming a mask (not shown) over wafer 101 with an opening over the location of trench 1001. Wafer 101 is then exposed to an anisotropic plasma etch with an etch chemistry that etches both polysilicon and oxide. However, in other embodiments, wafer 101 would be subject to two separate etches, one with an etch chemistry that etches oxide, and the other that etches polysilicon. After the formation of trench 1001, the mask is removed.

Figure 12:
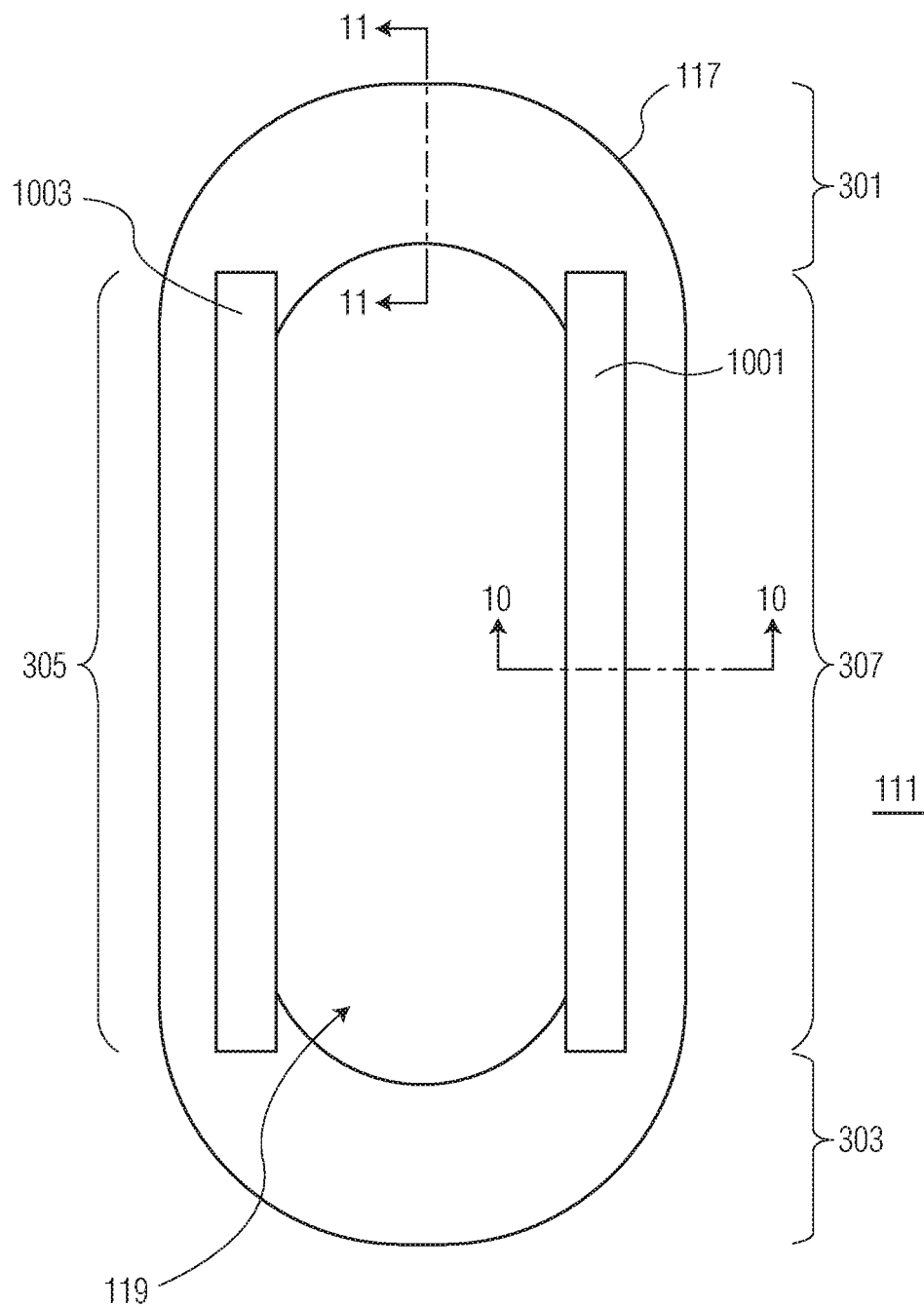

FIG. 12 is a partial top view of wafer 101 showing the locations of the cutaway views of FIGS. 11 and 12 at the same stage. As shown in FIG. 12, trench 1001 and trench 1003, which is similar to trench 1001, are only formed in device regions 307 and 305, respectively. For the most part, they are not located in termination regions 301 and 303.

Figure 13:
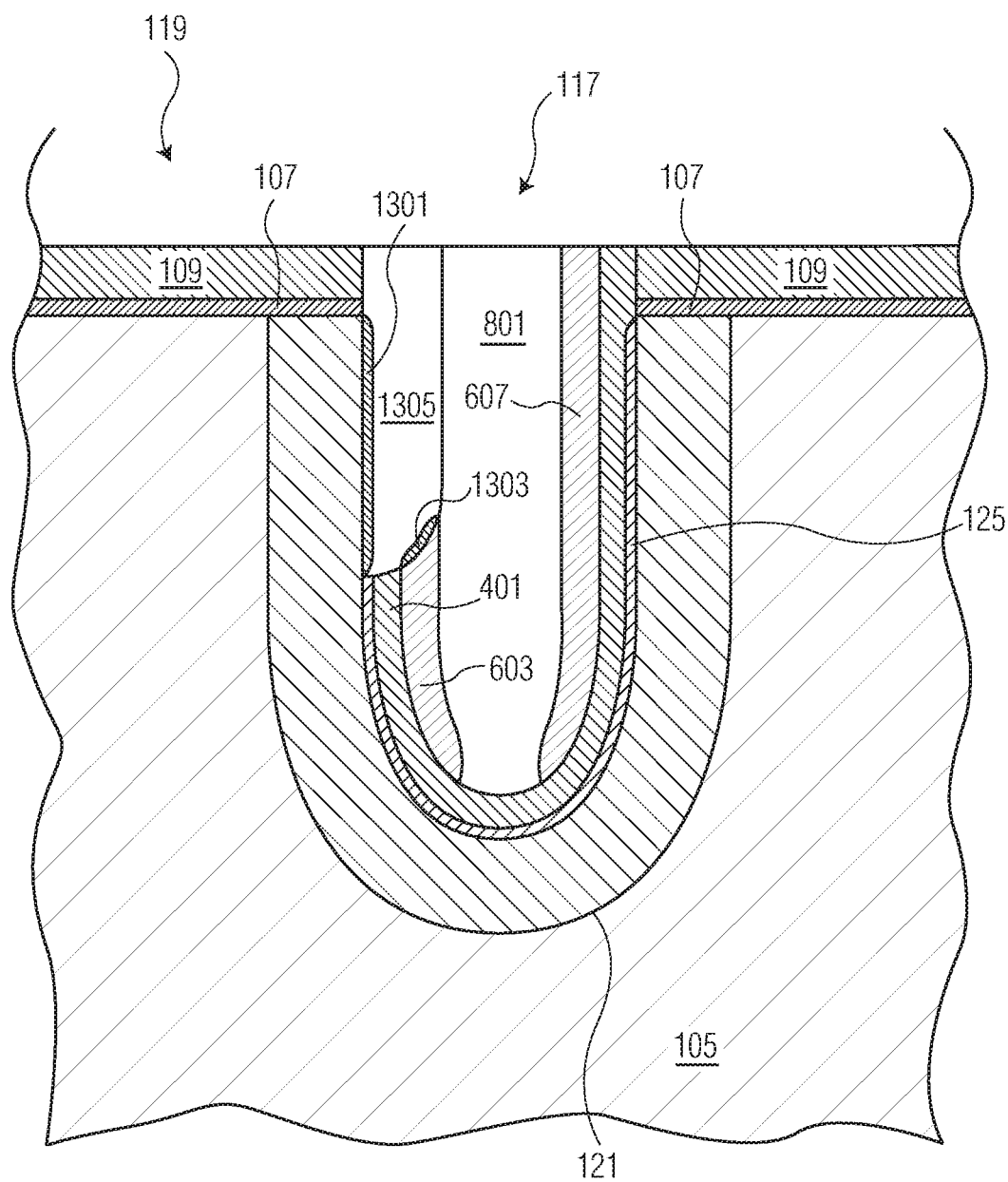
Figure 14:
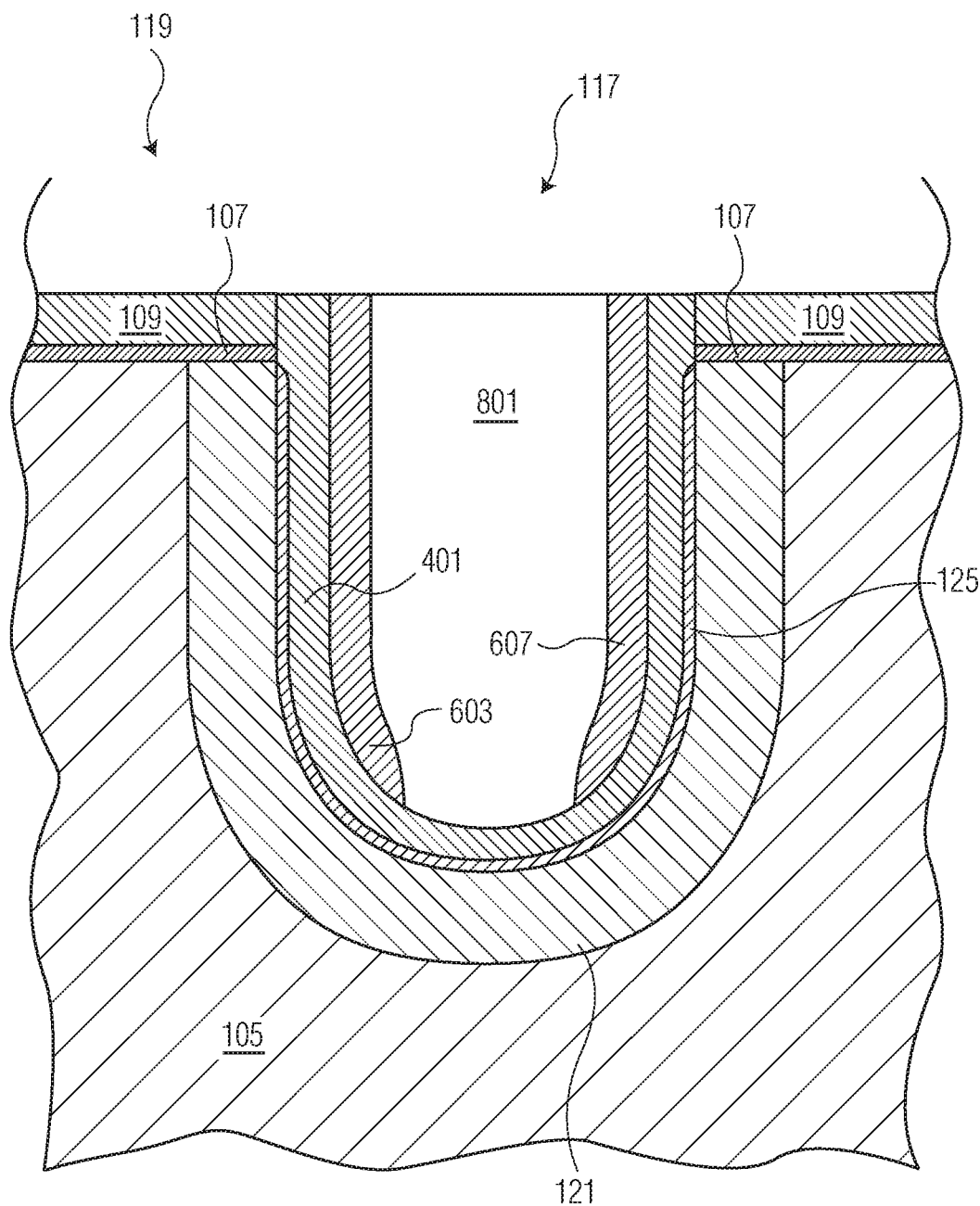

FIGS. 13 and 14 are partial cutaway side views of wafer 101 at the locations of FIGS. 1 and 2, respectively. FIGS. 13 and 14 show wafer 101 after a gate structure 1305 is formed in trench 1001. In one embodiment, gate structure 1305 is formed by forming a layer of gate material (e.g. doped polysilicon) over wafer 101 and planarizing wafer 101 utilizing layer 109 as a planarizing stop. Prior to depositing the gate material, wafer 101 is subject to an oxidation process where a gate dielectric 1031 is formed on sidewall 130 and dielectric 1303 is formed on the top portion of structure 603 to provide a dielectric separation with gate structure 1305. In some embodiment, dielectrics 1301 and 1303 are formed by depositing a dielectric layer (not shown) on wafer 101 including in trench 1001.

Figure 15:
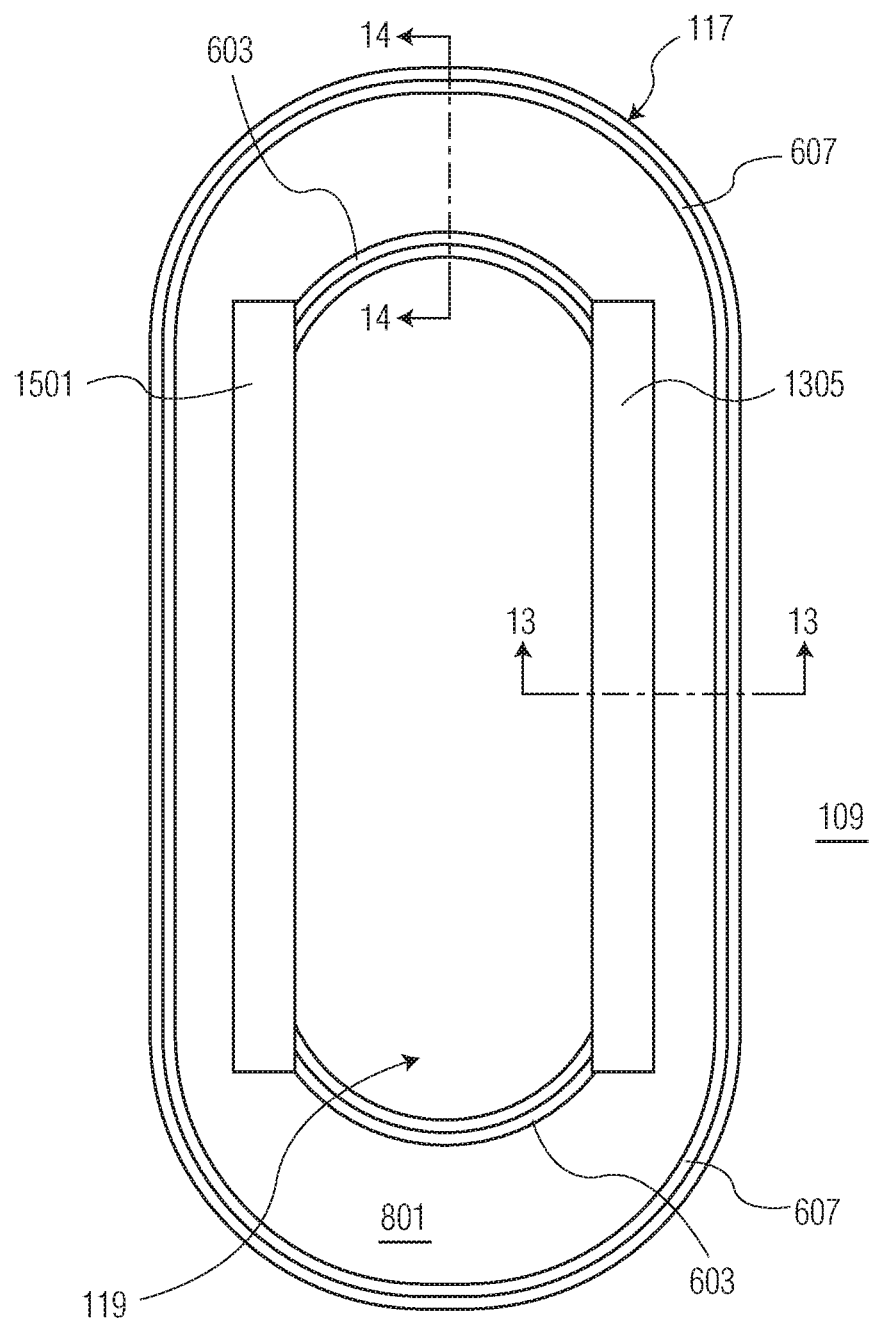

FIG. 15 is a partial top view of wafer 101 showing the locations of the cutaway views of FIGS. 13 and 14 at the same stage. As shown in FIG. 15, gate structure 1305 is formed in trench 1001 and a second gate structure 1501 is formed in trench 1003.

Figure 16:
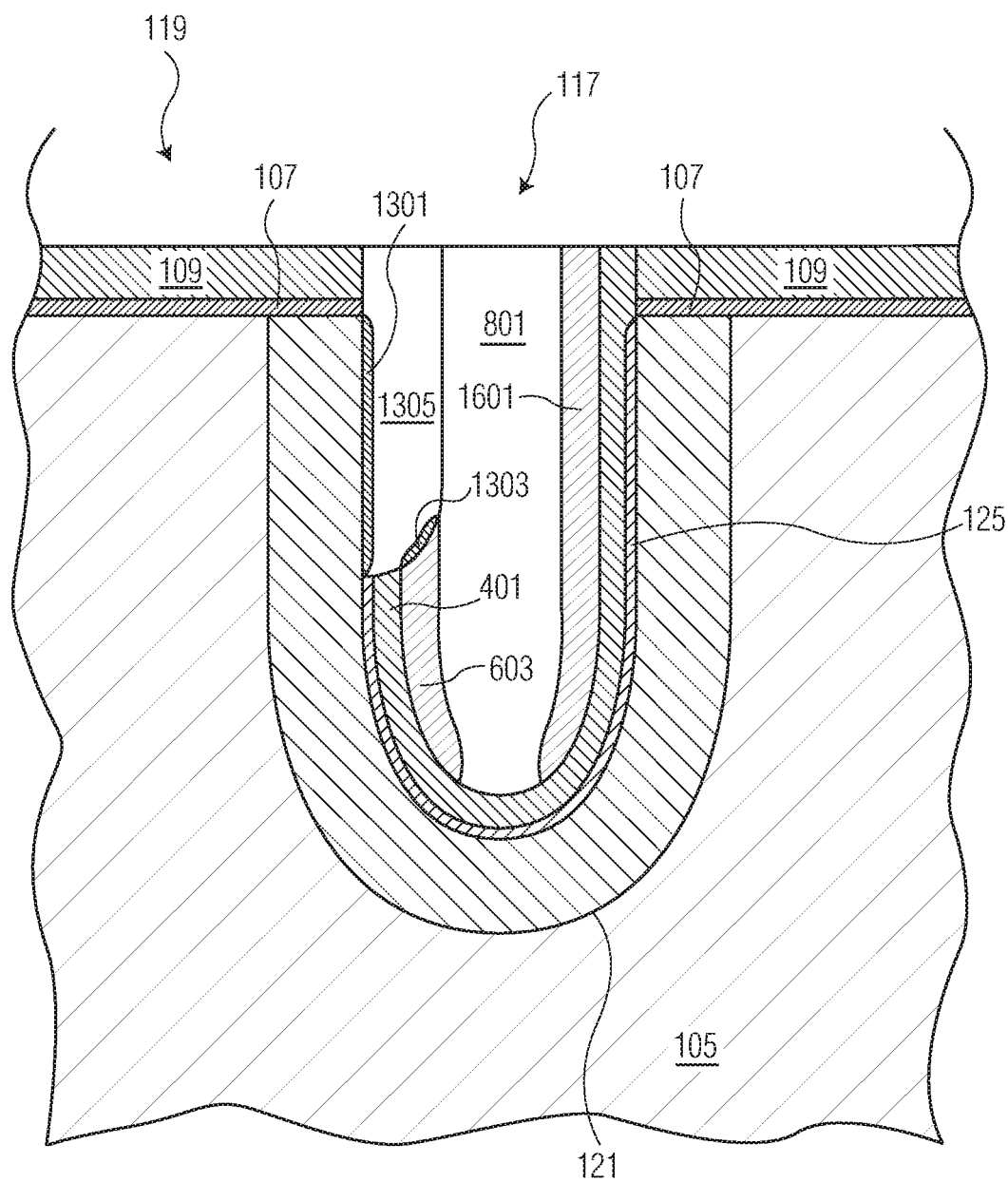
Figure 17:
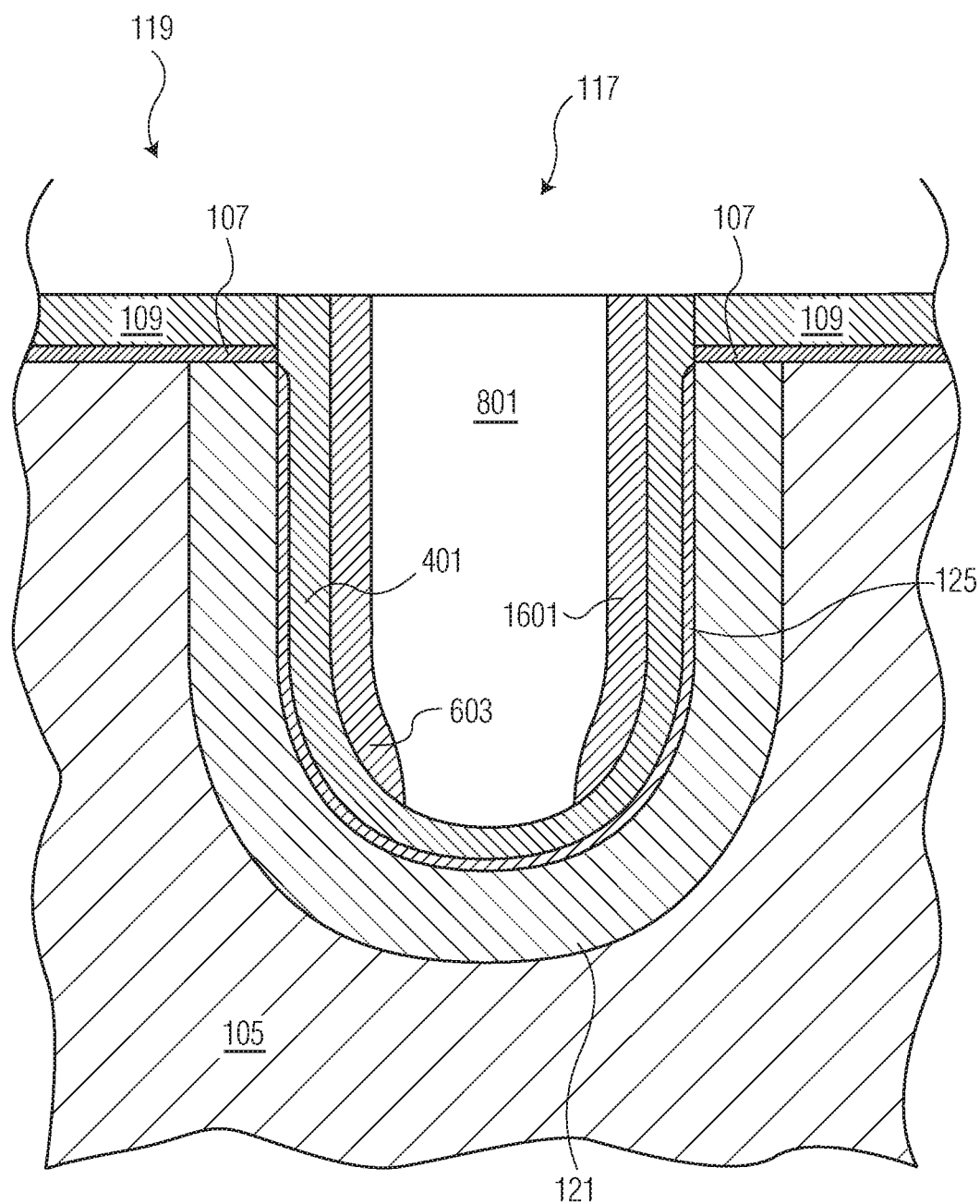

FIGS. 16 and 17 are partial cutaway side views of wafer 101 at the locations of FIGS. 1 and 2, respectively. FIGS. 16 and 17 show wafer 101 after conductive structure 607 is removed and dielectric structure 1601 is formed in its place. In one embodiment, a patterning mask (not shown) is formed over wafer 101 with an opening to expose structure 601 but not gate structure 1305 or structure 603. Structure 607 is then removed with the appropriate etch chemistry such that oxide structure 801 remains. In one embodiment, a layer of dielectric material is deposited over wafer 101 where it fills or at least partially fills the opening left from the removal of structure 607. Wafer 101 is then planarized using layer 109 as an etch stop to form dielectric structure 1601.

Figure 18:
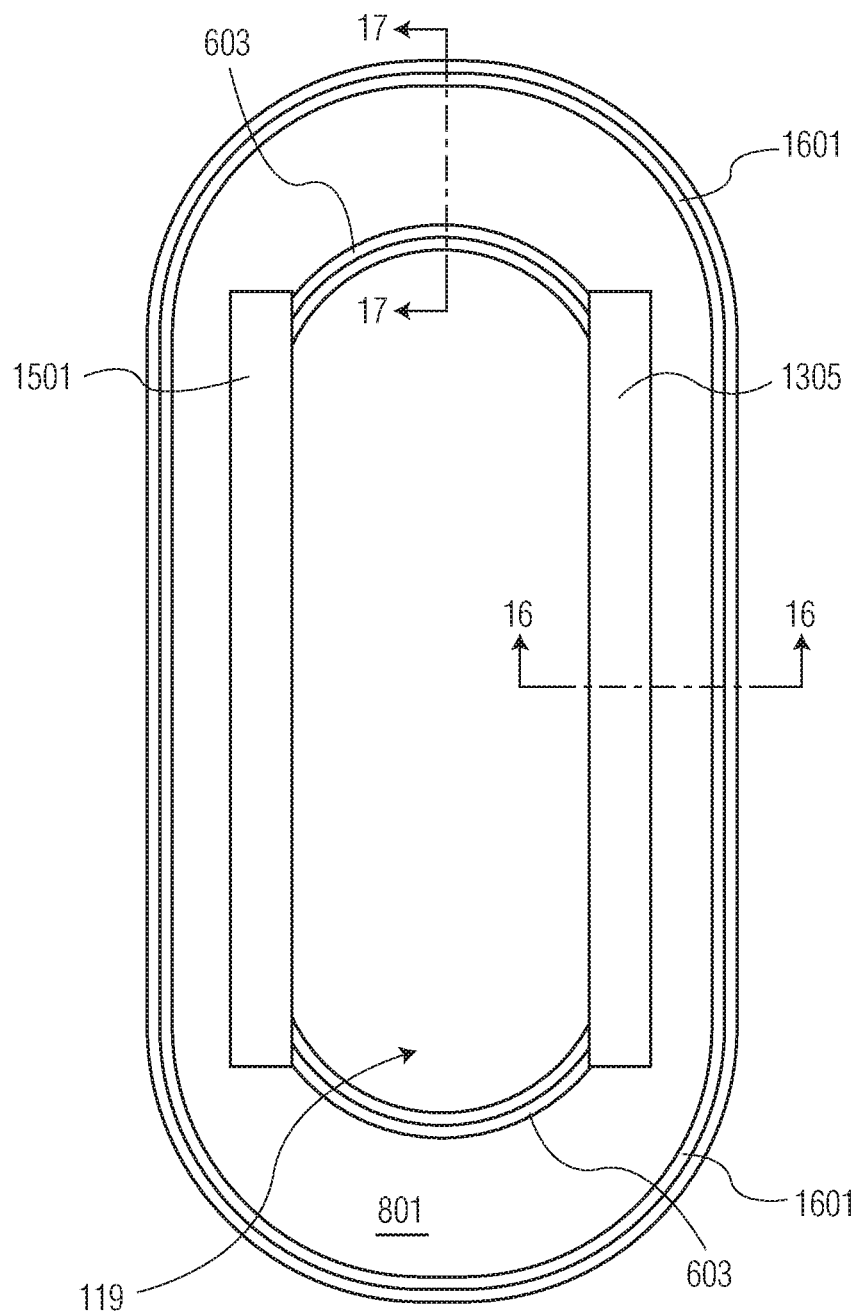

FIG. 18 is a partial top view of wafer 101 showing the locations of the cutaway views of FIGS. 16 and 17 at the same stage. FIG. 18 shows the location of dielectric structure 1601.

Figure 19:
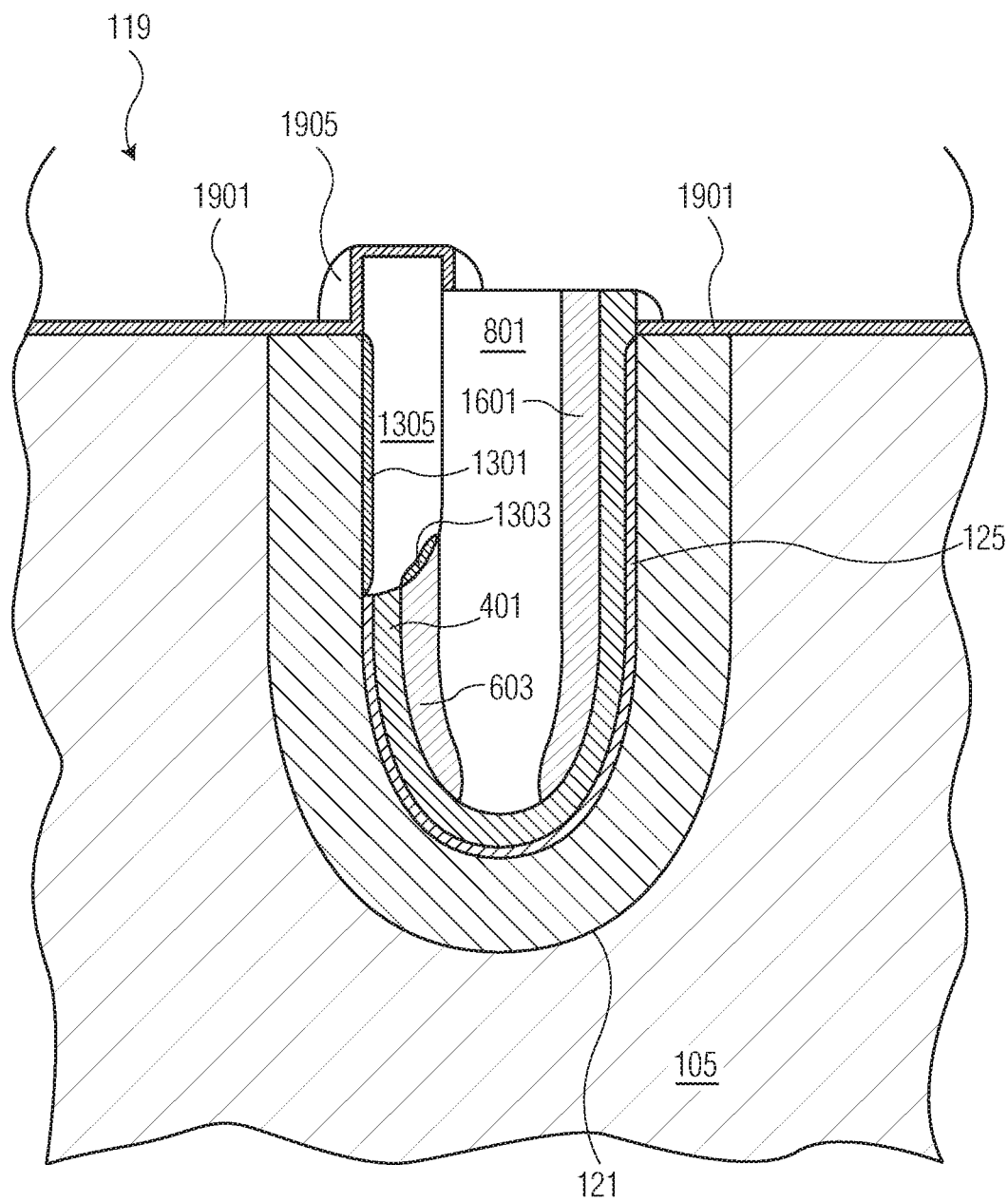
Figure 20:
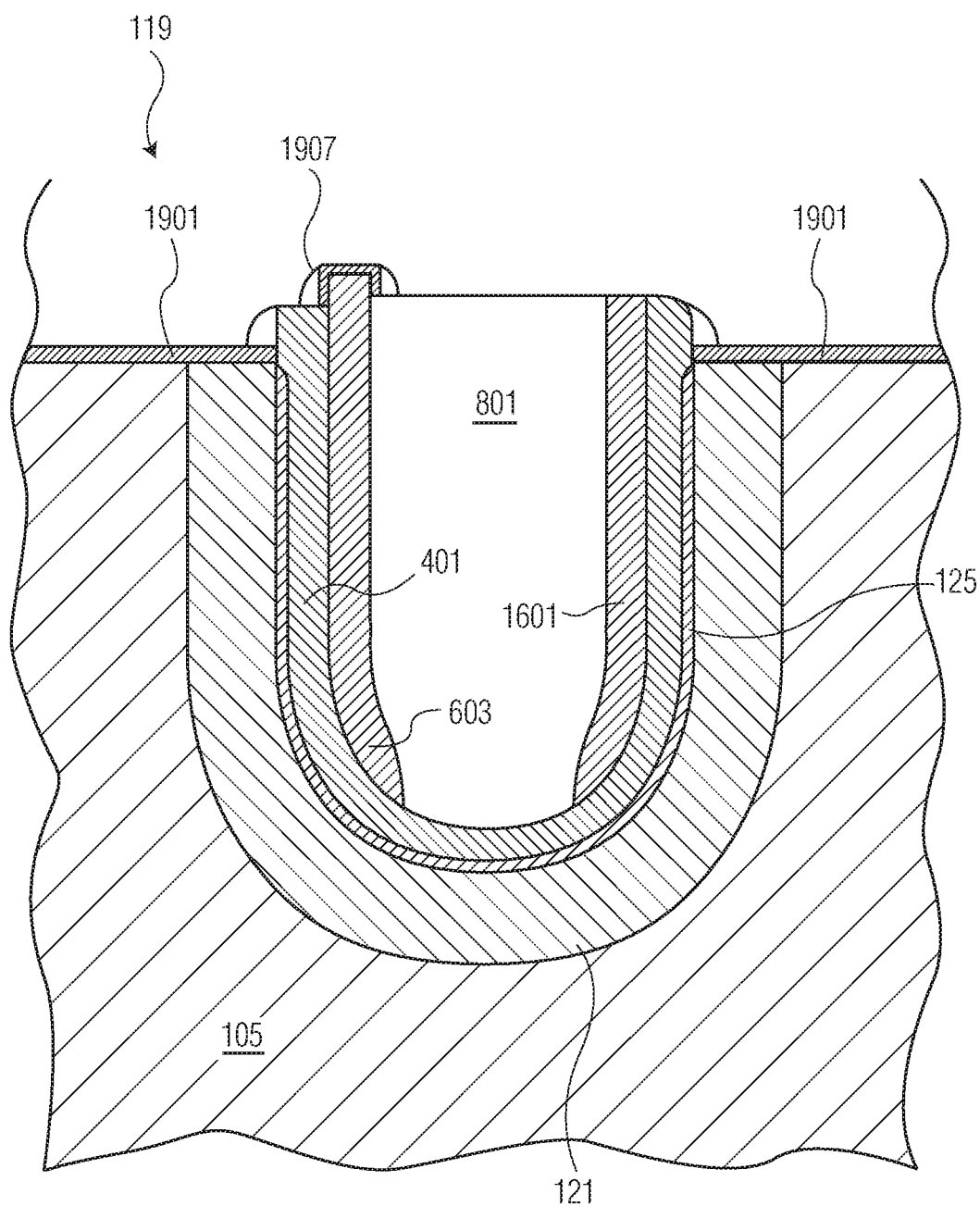

FIGS. 19 and 20 are partial cutaway side views of wafer 101 at the locations of FIGS. 1 and 2, respectively. FIGS. 19 and 20 show wafer 101 after nitride layer 109 and oxide pad layer 107 are stripped with an appropriate etch chemistries to remove those layers. During the removal of layer 107, a top portion of oxide structure 801 and dielectric structure 1601 are removed as well from the etching of the oxide. Afterwards, wafer 101 is subject to an oxidation process to form oxide layer 1901 on the exposed silicon structures. Nitride spacer 1905 and 1907 are then formed on wafer 101 for isolation of the gate contacts from other contacts.

Figure 21:
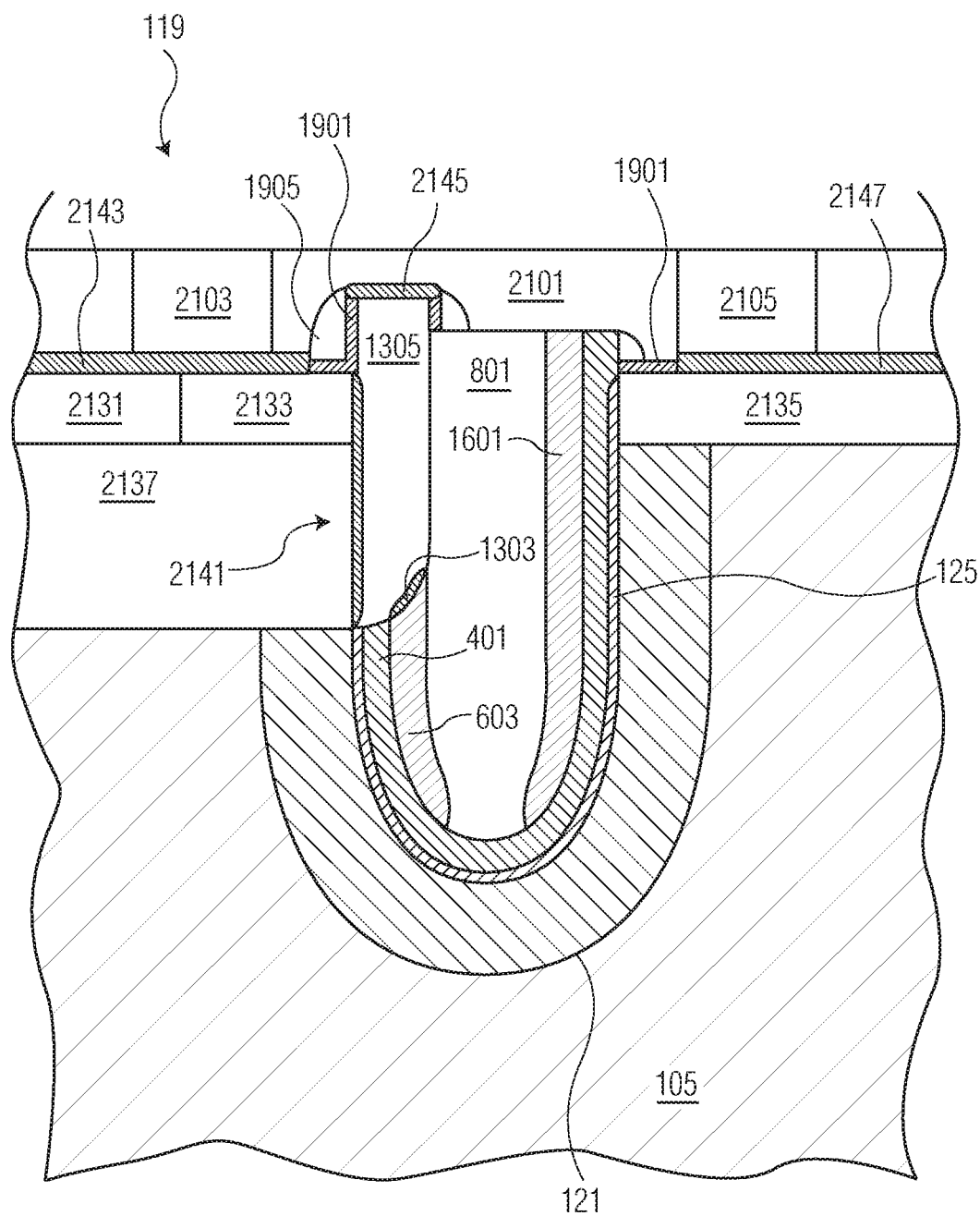
Figure 22:
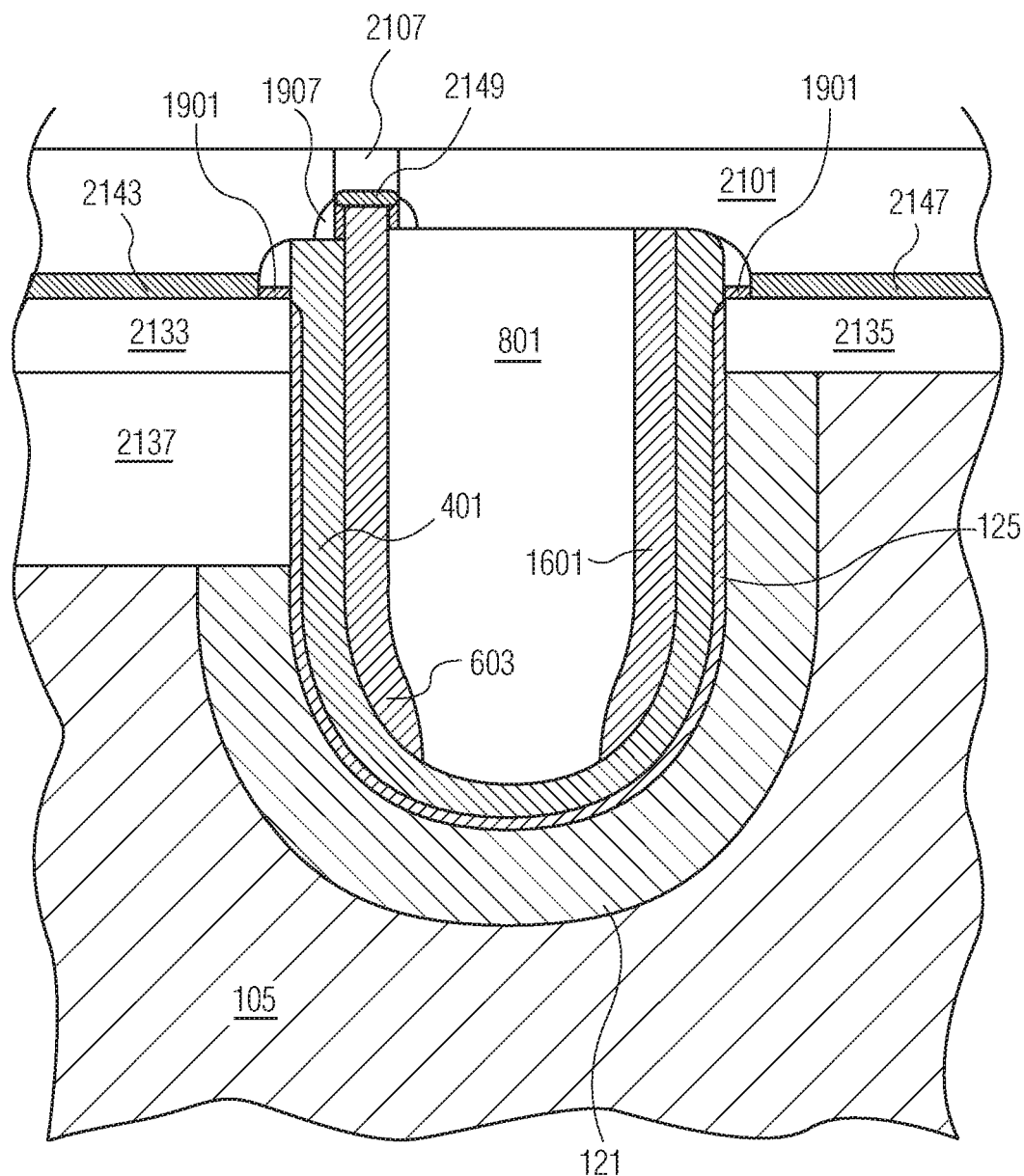

FIGS. 21 and 22 are partial cutaway side views of wafer 101 at the locations of FIGS. 1 and 2, respectively. FIGS. 21 and 22 show wafer 101 after P-well region 2137 is formed in substrate 105 by the ion implantation of P-type dopants (e.g. boron) into substrate 105. In one embodiment, boron is selectively implanted at an energy of 180 keV and dosage of 1.0e13 cm-2, but may be implanted at other energies and/or other dosages in other embodiments. In one embodiment, implantation is followed by an annealing step.

Afterwards, source region 2133 and drain region 2135 are formed by the selective implantation of N-type dopant ions into substrate 105. The N-type dopant ions are implanted through a patterned implant mask (not shown) formed on wafer 101. In one embodiment, arsenic ions at a dose of 5e15 cm-2 are implanted at 120 keV, and phosphorus ions at a dose of 1.5 e15 cm-2 are implanted at 55 keV. Other N-type dopants may be implanted at other doses and/or at other energies in other embodiments. Body contact region 2131 is formed by implanting P-type dopant ions into P-well region 2137. In one embodiment, boron ions are implanted through a patterned implant mask (not shown) formed on wafer 101 with a dose of 1.5e15 cm-2 and an energy of 25 keV to form body contact region 2131. Implantation is followed by and annealing step, e.g. rapid thermal annealing (RTA).

After the formation of source region 2133, drain region 2135, and body contact region 2131, wafer 101 is subject to a silicidation process to form silicide structures 2143, 2145, 2147, and 2149 on exposed silicon locations. In some embodiments, wafer 101 is subject to an oxide etch to remove layer 1901 prior to forming the silicide structures. A layer of metal (e.g. titanium tungsten) is then deposited over wafer 101. Wafer 101 is then annealed to form the metal silicide, and the unreacted metal is removed.

A layer 2101 of interlevel dielectric material is formed on wafer 101. In one embodiment, layer 2101 is an oxide formed by a TEOS process, but may be of another material in other embodiments. Openings are then formed in layer 2101 for the formation of metal contacts to electrically contact the transistor structures. In the embodiment shown, contact 2103 contacts both source region 2133 and body contact region 2131. Contact 2105 contacts drain region 2135. In other embodiments, the source region and body contact region may have different contacts to be individually biased at different voltages. Contact 2017 contacts field plate structure 603. Not shown in the partial cutaway view of FIG. 21 are the contacts (2323 and 2327) for gate structures 1305 which is located outside the view of FIG. 21.

As can be shown in FIG. 21, a transistor includes a source region 2133, a drain region 2135, a channel region 2141 located in well region 2137 including a portion located along sidewall 130, a drift region 121, a gate structure 1305 and a field plate structure 603.

Figure 23:
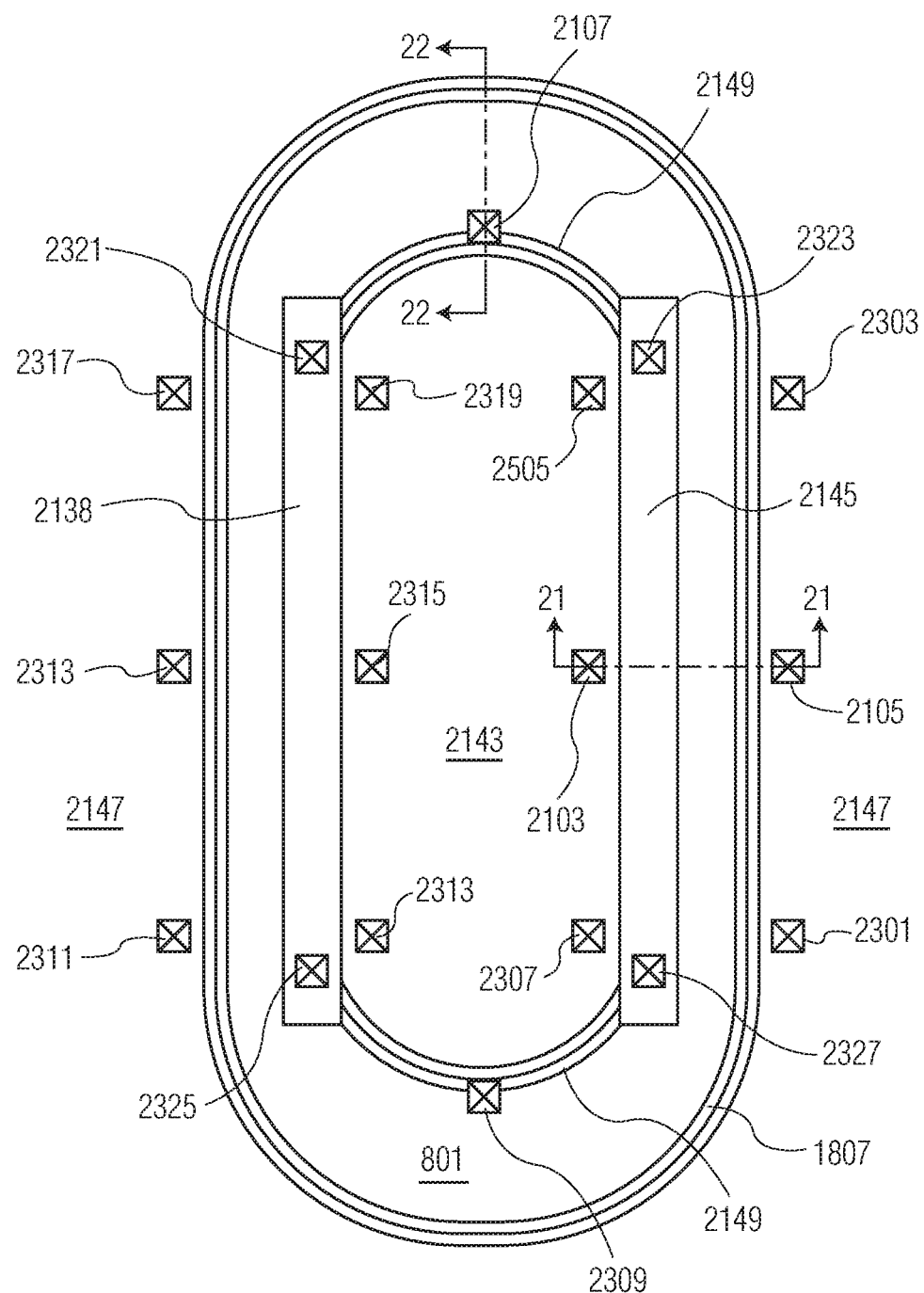

FIG. 23 shows a top view of wafer 101 prior to the formation of oxide layer 2101. In FIG. 23, the boxes with "X's" designate the locations of the contacts to be formed in layer 2101. For simplicity of the drawing, sidewall spacers 1905 and 1907 are not shown in FIG. 23. As shown in FIG. 23, contacts 2323 and 2327 will be formed to contact silicide 2145 of gate structure 1305. Contacts 2321 and 2325 will be formed to contact gate silicide 2138 of gate structure 1501. Contacts 2303, 2105, 2301, 2317, 2313, and 2311 will be formed to contact drain silicide 2147, and contacts 2319, 2315, 2313, 2305, 2103, and 2307 will be formed to contact source silicide 2143 (which also contacts body region 2131). Contacts 2107 and 2309 will be formed to contact field plate silicide 2149 in the termination regions.

As shown in the embodiment of FIG. 21, field plate structure 603 is located farther away from vertical component trench sidewall 130 than gate structure 1305. Also, field plate structure 603 is located closer to sidewall 130 than sidewall 132. In one embodiment, Employing the field plate structure in this manner allows for increased BV by spreading the equipotential lines such that electric field does not peak at the gate corner.

After the stage shown in FIGS. 21 and 22, other processes may be performed on wafer 101 such as forming additional interconnect layers. For example, interconnects may be formed to electrically couple together gate structures 1305 and 1501. Afterwards, external terminals e.g. bond pads are formed on wafer 101. Wafer 101 is then singulated into multiple die where each die includes at least one transistor device having structures shown in FIGS. 21 and 22. Afterwards, the die are packaged in semiconductor packaging material to form integrated circuit packages where they are shipped to end use manufacturers to include in end use products such as automobiles, battery control systems, and industrial equipment. In other embodiments, a transistor may include other structures and/or may be formed by other processes. Furthermore, additional process steps may be added to form other components on the same substrate. In some embodiments, field plate contact 2107 may be electrically coupled to source contact 2103 so as to be biased at a same potential during operation. In other embodiments, field plate structure 603 maybe electrically coupled to gate structures 1305 and 1501 so as to be biased at a same potential during operation.

Figure 24:
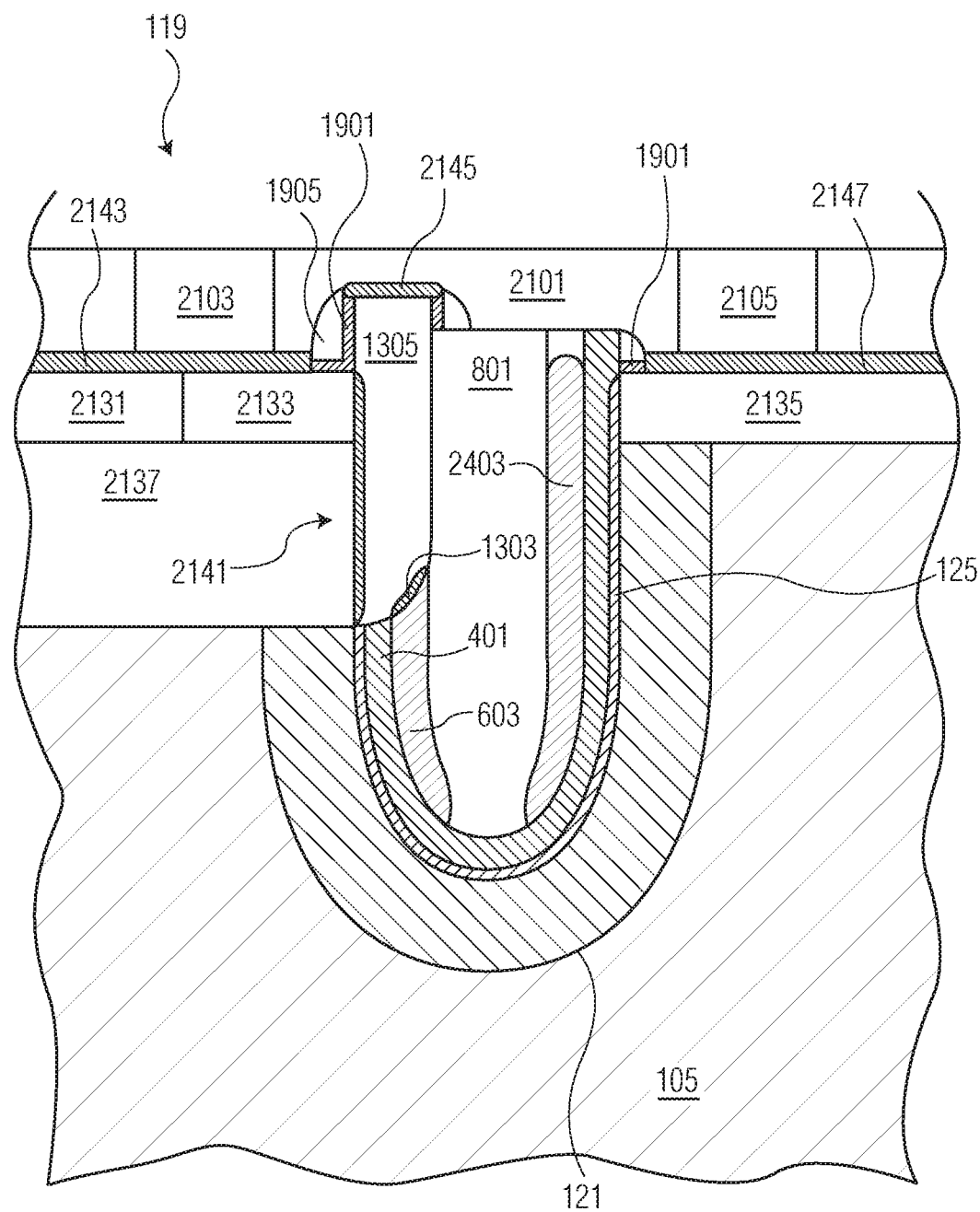
FIGS. 24-25 set forth partial cutaway side views of various stages in the manufacture of a semiconductor device according to another embodiment of the present invention.
Figure 25:
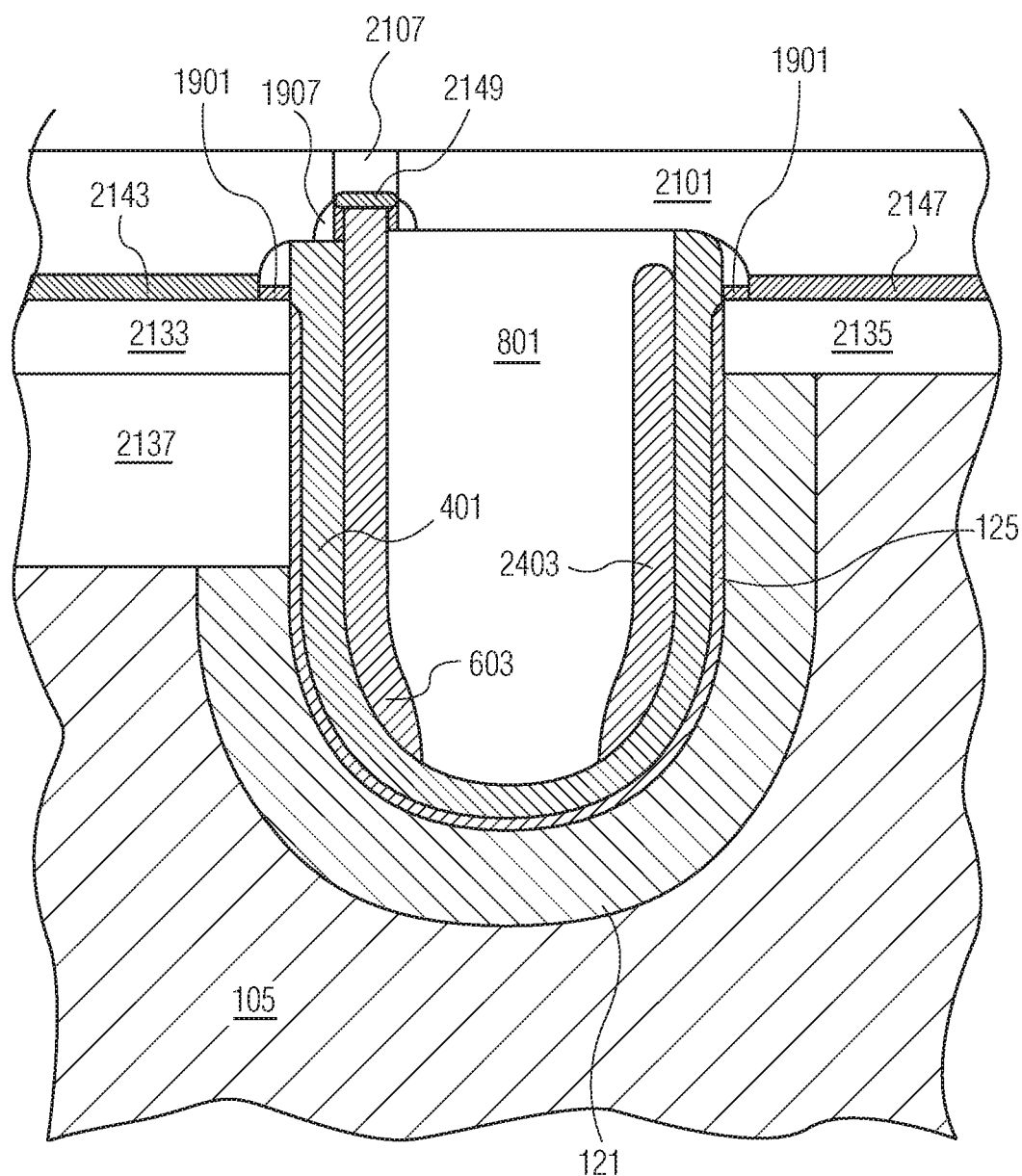

FIGS. 24 and 25 set forth partial cutaway side views of a transistor according to another embodiment. Items in FIGS. 24 and 25 having the same reference numbers are similar to the items of the embodiment of FIGS. 21 and 22. The transistor of FIGS. 24 and 25 is similar to the transistor of FIGS. 21 and 22 except that the transistor of FIGS. 24 and 25 has an air cavity 2403 in place of dielectric structure 1601 of the transistor of FIGS. 21 and 22. In one embodiment, after the stage in FIGS. 13 and 14 when conductive structure 607 is removed, a dielectric sealing layer (not shown) is formed over wafer 101 to seal the opening to form air cavity 2403. Wafer 101 is then planarized using layer 109 has a planarization stop. In one embodiment, the sealing layer is formed by forming a plug on top of the region of cavity 2403 However, the air cavity maybe formed by other processes in other embodiments. In one embodiment, air cavity 2403 provides the trench with a lower dielectric constant to improve breakdown voltage.

Figure 26:
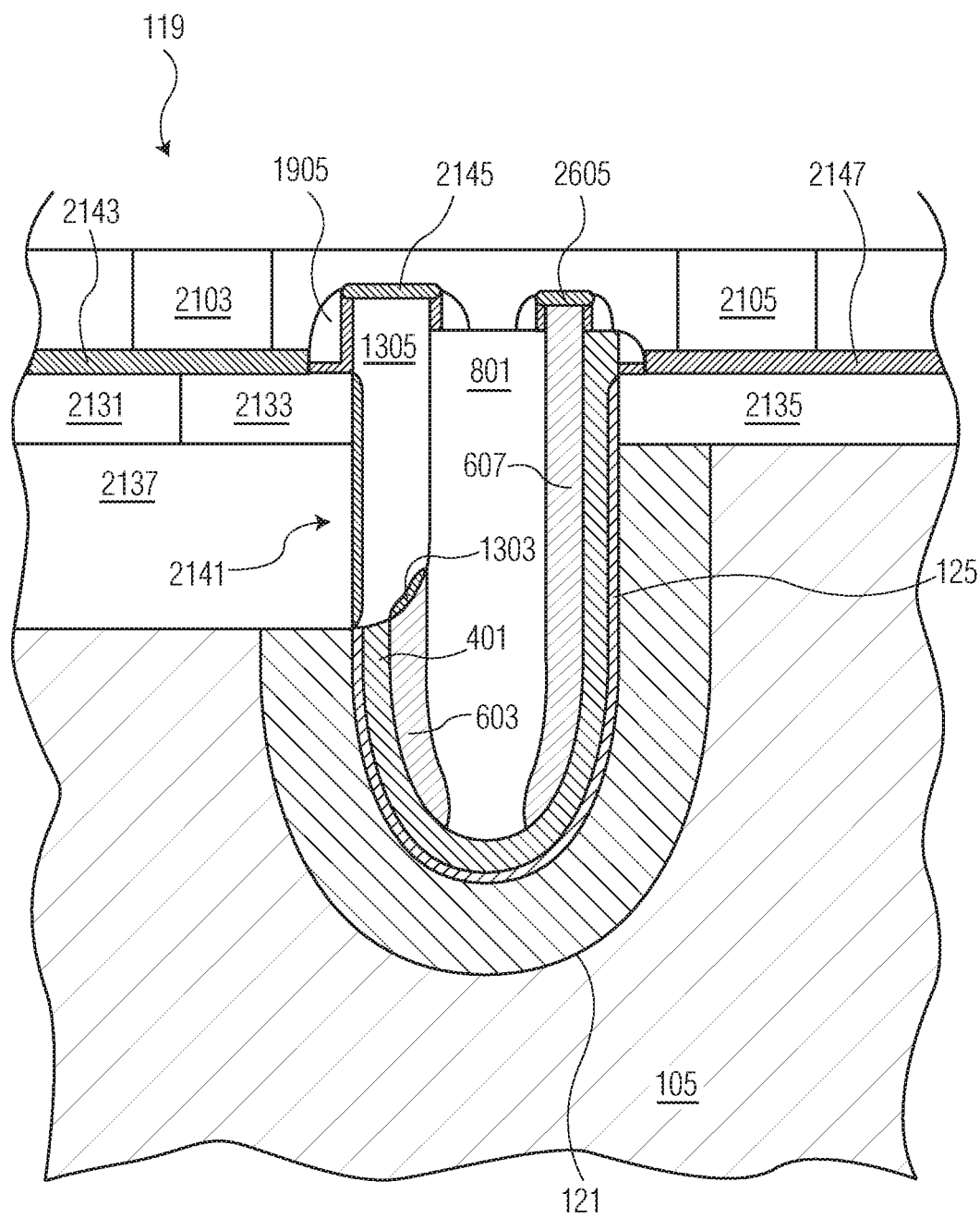
FIGS. 26-27 set forth partial cutaway side views of various stages in the manufacture of a semiconductor device according to another embodiment of the present invention.
Figure 27:
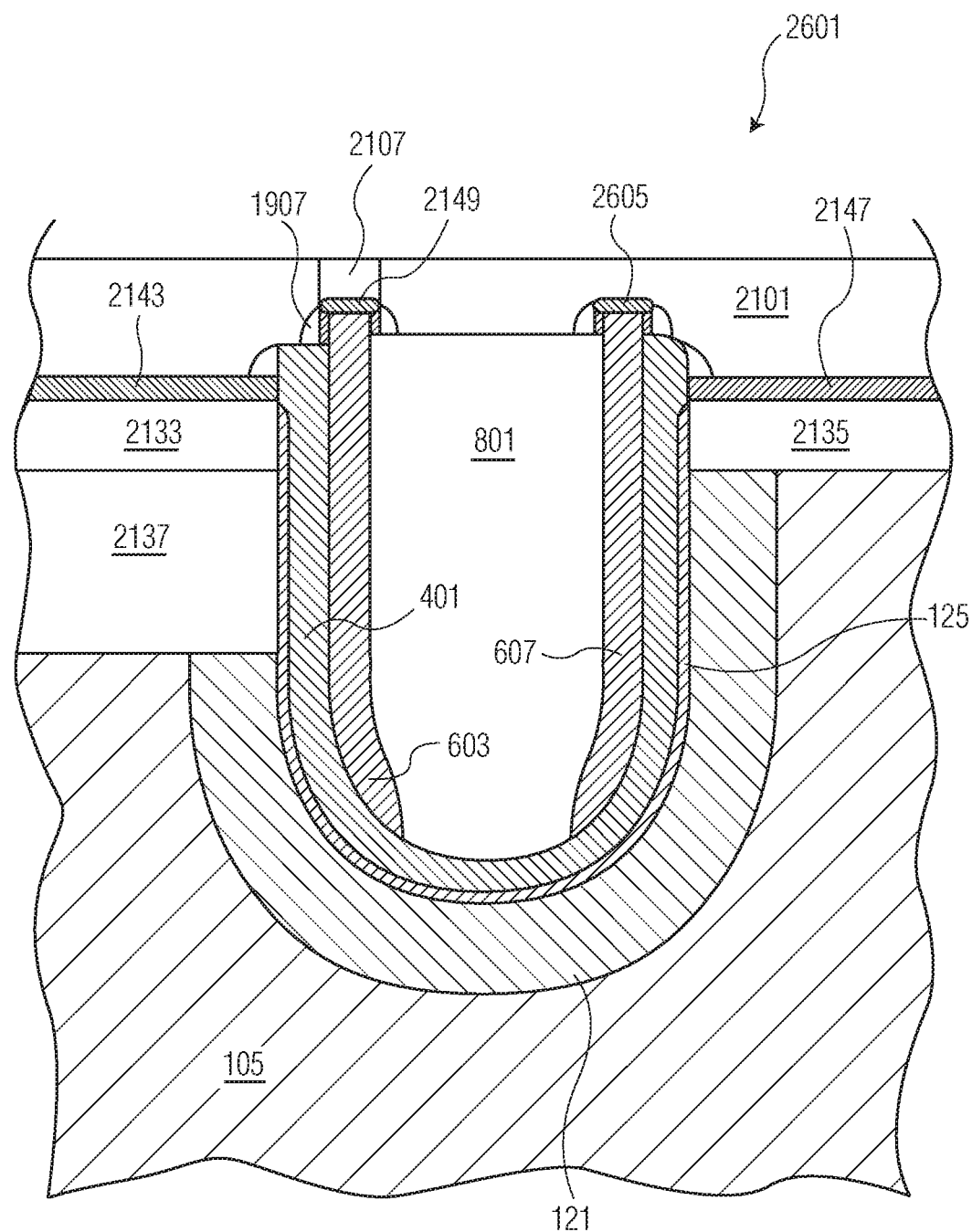

FIGS. 26 and 27 set forth partial cutaway side views of a transistor according to another embodiment. Items in FIGS. 26 and 27 having the same reference numbers are similar to the items of the embodiment of FIGS. 21 and 22. In the embodiment of FIGS. 26 and 27, field gate structure 607 is not removed from wafer 101, but instead is left in and is floating and is not electrically coupled to any external terminal of an integrated circuit that includes the transistor.

One advantage that may occur with at least some of the processes described herein is that a transistor with a gate and field plate closer to one edge of a trench can be more efficiently manufactured. Also, a reliable electrical coupling between gate structure 1305 and silicide 2145 can be made in that gate structure 1305 can be made larger due to the formation of the second trench.

With some devices, drift region dopants can accumulate at higher than desirable levels at termination regions due to the geometric shape of a trench, which may decrease the breakdown voltages at those regions. One advantage that may occur in some embodiments with providing a wider trench in the termination region than in the device region is that less drift region dopants may accumulate in the termination region to improve breakdown voltage.

Although FIGS. 21, 24, and 26 set forth three different embodiments of a transistor, other embodiments of transistors may have other structures, features, regions, configurations, or doping concentrations. For example, although the transistors are shown to be P-type FETs, N-Type FETs may be formed by switching the doping conductivity types.

In addition, in other embodiments, other types of transistors may be implemented with a wider trench in the termination region than in the device region. In other embodiments, the trench may include a combined gate/field plate structure, or include multiple field plate structures. Also, in other embodiments, the gate and/or field plate structure may be symmetrically located in the trench.

As disclosed herein, a first structure is "directly over" a second structure if the first structure is located over the second structure in a line having a direction that is perpendicular with the generally planar major side of the wafer. For example, in FIG. 21, contact 2103 is directly over region 2137. Contact 2103 is not directly over region 2135. As disclosed herein, a first structure is "directly beneath" a second structure if the first structure is located beneath the second structure in a line having a direction that is perpendicular with the generally planar major side of the wafer. For example, in FIG. 21, region 2131 is directly beneath contact 2103. Region 2131 is not directly beneath contact 2105. One structure is "directly between" two other structures in a line if the two structures are located on opposite sides of the one structure in the line. For example, in FIG. 21, gate structure 1305 is located directly between region 2131 and 2135 in a line in the cut away side view of FIG. 12. Field plate structure 603 is not located directly between regions 2131 and 2135 in a line. One structure is "laterally between" two other structures if the two structures are located on opposite sides of the one structure in the line that is parallel with a generally planar major side of the wafer. For example, gate structure is laterally between regions 2133 and 2135. A "vertical component sidewall" of a trench is a portion of a trench sidewall having a profile that overall, the majority component of the portion is vertical even though it may also have a horizontal component or that it may have minor horizontal discontinuity at an interior location of the sidewall portion. For example, a portion of a sidewall sloped at 70 degrees may be considered a vertical component sidewall portion.

Features shown or described herein with respect to one embodiment may be implemented in other embodiments shown or described herein.

In one embodiment, a semiconductor device includes a substrate including a semiconductor material. A trench is located in the semiconductor material. The semiconductor device includes a source region located in the semiconductor material with respect to a first side of the trench and a gate structure located in the trench. The semiconductor device includes a channel region including a portion located along a first vertical component sidewall of the trench. The first vertical component sidewall is located with respect to the first side of the trench. The trench includes a device section, wherein the gate structure is located in at least the device section. The trench has a first transverse cross-sectional width at a first location of the trench in the device section. The trench includes a termination section, wherein the trench has a second transverse cross-sectional width at a second location in the termination section that is wider than the first transverse cross-sectional width.

In another embodiment, a semiconductor device includes a substrate including a semiconductor material. A trench is located in the semiconductor material. The semiconductor device includes a source region located in the semiconductor material with respect to a first side of the trench, a drain region including at least a portion located in the semiconductor material with respect to a second side of the trench opposing the first side of the trench, a gate structure located in the trench, a field plate structure located in a trench, and a channel region including a portion located along a first vertical component sidewall of the trench. The first vertical component sidewall is located with respect to the first side of the trench. The trench includes a device section wherein the gate structure is located in at least the device section. The trench has a first transverse cross-sectional width at a first location of the trench in the device section. The trench includes a termination section. The trench has a second transverse cross-sectional width at a second location in the termination section that is wider than the first transverse cross-sectional width by at least 10% of the first transverse cross-sectional width, the gate structure is not located at the second location. The field plate structure is located at the second location.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed:

1. A semiconductor device comprising:
   a substrate including a semiconductor material, a trench located in the semiconductor material;
   a source region located in the semiconductor material with respect to a first side of the trench;
   a gate structure located in the trench;
   a channel region including a portion located along a first vertical component sidewall of the trench, the first vertical component sidewall located with respect to the first side of the trench;
   wherein the trench includes a device section, wherein the gate structure is located in at least the device section, the trench having a first transverse cross-sectional width at a first location of the trench in the device section;
   wherein the trench includes a termination section, wherein the trench has a second transverse cross-sectional width at a second location in the termination section that is wider than the first transverse cross-sectional width.

2. The semiconductor device of claim 1 wherein the termination section of the trench is characterized as having a curved shape.

3. The semiconductor device of claim 1 including a drift region including a portion located at least directly below the trench.

4. The semiconductor device of claim 1 wherein the second transverse cross-sectional width is wider than the first transverse cross-sectional width by at least 10% of the first transverse cross-sectional width.

5. The semiconductor device of claim 1 wherein the second transverse cross-sectional width is wider than the first transverse cross-sectional width by a ratio in a range of 10-200% of the first transverse cross-sectional width.

6. The semiconductor device of claim 1 further comprising:
   a drain region including a portion located in an upper surface of the semiconductor material with respect to a second side of the trench opposite the first side.

7. The semiconductor device of claim 1 wherein the first transverse cross-sectional width has first orientation and the second transverse cross-sectional width has a second orientation that is orthogonal to the first orientation.

8. The semiconductor device of claim 1 wherein the trench includes a second device section, wherein a second gate structure is located in at least the second device section, the termination section is located along the trench between the device section and the second device section.

9. The semiconductor device of claim 8 wherein the trench has a third transverse cross-sectional width at a third location of the trench in the second device section.

10. The semiconductor device of claim 9 wherein the trench includes a second termination section wherein the trench has a fourth transverse cross-sectional width at a fourth location in the second termination section that is wider than the third transverse cross-sectional width.

11. The semiconductor device of claim 8 wherein the device section of the trench runs in a first orientation and the second device section runs in an orientation that is parallel with the first orientation.

12. The semiconductor device of claim 8 wherein the termination section of the trench is characterized as having a curved shape.

13. The semiconductor device of claim 1 further comprising a field plate structure located in the trench at the first location and the second location.

14. The semiconductor device of claim 13 wherein the gate structure is not located at the second location.

15. The semiconductor device of claim 14 wherein the field plate structure includes an upper portion in the second location that is laterally located with respect to the gate structure at the first location.

16. The semiconductor device of claim 13 wherein in the first location, the gate structure is located directly over the field plate structure.

17. The semiconductor device of claim 13 wherein the field plate structure is located closer to the first vertical component sidewall of the trench than an opposing second vertical component sidewall of the trench.

18. The semiconductor device of claim 1 further comprising a dielectric physically separating the gate structure and the field plate structure at the first location.

19. The semiconductor device of claim 1 wherein the gate structure is located closer to the first vertical component sidewall of the trench than an opposing second vertical component sidewall of the trench.

20. The semiconductor device of claim 1 wherein the second transverse cross-sectional width is wider than the first transverse cross-sectional width by a ratio in the range of 40-60% of the first transverse cross-sectional width.

21. The semiconductor device of claim 1 wherein the gate structure is not located at the second location.

22. A semiconductor device comprising:
   a substrate including a semiconductor material, a trench located in the semiconductor material;
   a source region located in the semiconductor material with respect to a first side of the trench;
   a drain region including at least a portion located in the semiconductor material with respect to a second side of the trench opposing the first side of the trench;
   a gate structure located in the trench;

a field plate structure located in the trench;
a channel region including a portion located along a first vertical component sidewall of the trench, the first vertical component sidewall located with respect to the first side of the trench;
wherein the trench includes a device section wherein the gate structure is located in at least the device section, the trench having a first transverse cross-sectional width at a first location of the trench in the device section;
wherein the trench includes a termination section, wherein the trench has a second transverse cross-sectional width at a second location in the termination section that is wider than the first transverse cross-sectional width by at least 10% of the first transverse cross-sectional width, the gate structure is not located at the second location, the field plate structure is located at the second location.

\* \* \* \* \*